(12) United States Patent
Shang et al.

(10) Patent No.: US 10,527,422 B2
(45) Date of Patent: Jan. 7, 2020

(54) MICRO THREE-DIMENSIONAL SHELL RESONATOR GYROSCOPE

(71) Applicant: SOUTHEAST UNIVERSITY, Nanjing (CN)

(72) Inventors: Jintang Shang, Nanjing (CN); Bin Luo, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 203 days.

(21) Appl. No.: 15/580,696

(22) PCT Filed: Dec. 15, 2016

(86) PCT No.: PCT/CN2016/110115
§ 371 (c)(1),
(2) Date: Dec. 8, 2017

(87) PCT Pub. No.: WO2017/101813
PCT Pub. Date: Jun. 22, 2017

(65) Prior Publication Data
US 2018/0188030 A1    Jul. 5, 2018

(30) Foreign Application Priority Data

Dec. 18, 2015  (CN) .......................... 2015 1 0963681
May 30, 2016  (CN) .......................... 2016 1 0375804
(Continued)

(51) Int. Cl.
*G01C 25/00*      (2006.01)
*G01C 19/5783*    (2012.01)
(Continued)

(52) U.S. Cl.
CPC ............ *G01C 19/5783* (2013.01); *B81B 7/02* (2013.01); *B81C 1/00269* (2013.01);
(Continued)

(58) Field of Classification Search
CPC ...... G01C 25/00; G01C 19/5783; B81B 7/02; B81C 1/00
(Continued)

(56) References Cited

U.S. PATENT DOCUMENTS

2017/0248422 A1*  8/2017  Najafi .................... C03C 15/00

FOREIGN PATENT DOCUMENTS

| CN | 101279713 A | 10/2008 |
|---|---|---|
| CN | 102686977 A | 9/2012 |

(Continued)

*Primary Examiner* — Jamel E Williams
(74) *Attorney, Agent, or Firm* — Gokalp Bayramoglu

(57) ABSTRACT

The present invention discloses a micro three-dimensional shell resonator gyroscope, a method for fabricating a micro shell resonator, a method for fabricating a composite structure substrate, and a method for fabricating a micro three-dimensional shell resonator gyroscope. A micro three-dimensional shell resonator gyroscope includes a packaging shell cover, a micro shell resonator, and a composite structure substrate. The micro shell resonator includes a shell, a single-ended column, and a flange. The composite structure substrate includes a non-planar electrode, a conductive structure, an electrical isolation part, and a main body part. The non-planar electrode includes a driving electrode, a detection circuit, an annular exciting electrode, and an isolation electrode.

21 Claims, 17 Drawing Sheets

(30) Foreign Application Priority Data

Sep. 9, 2016 (CN) .......................... 2016 1 0814217
Oct. 27, 2016 (CN) .......................... 2016 1 0954814

(51) Int. Cl.
*G01C 19/5691* (2012.01)
*B81B 7/02* (2006.01)
*B81C 1/00* (2006.01)

(52) U.S. Cl.
CPC ......... *G01C 19/5691* (2013.01); *G01C 25/00* (2013.01); *B81B 2201/0242* (2013.01); *B81C 1/00285* (2013.01)

(58) Field of Classification Search
USPC ...................................................... 73/504.13
See application file for complete search history.

(56) References Cited

FOREIGN PATENT DOCUMENTS

| | | | |
|---|---|---|---|
| CN | 105540530 A | 5/2016 | |
| CN | 106052664 A | 10/2016 | |
| WO | 2011147787 A3 | 6/2012 | |

\* cited by examiner

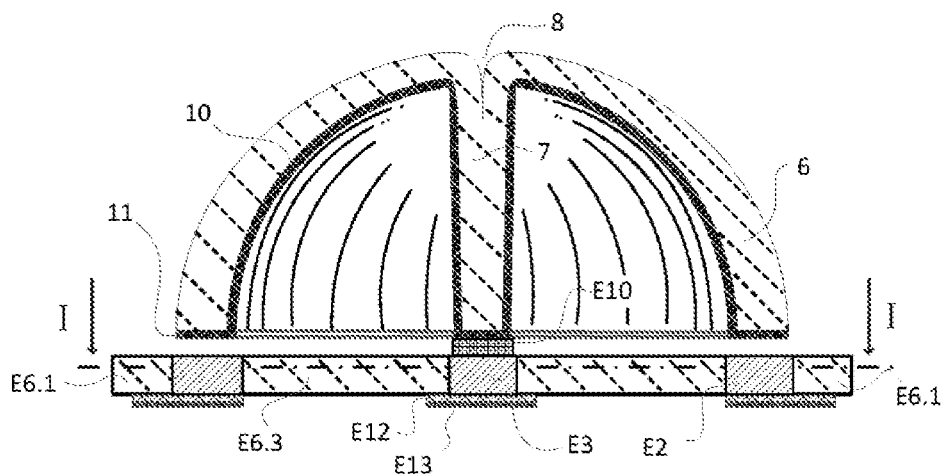
FIG.2a
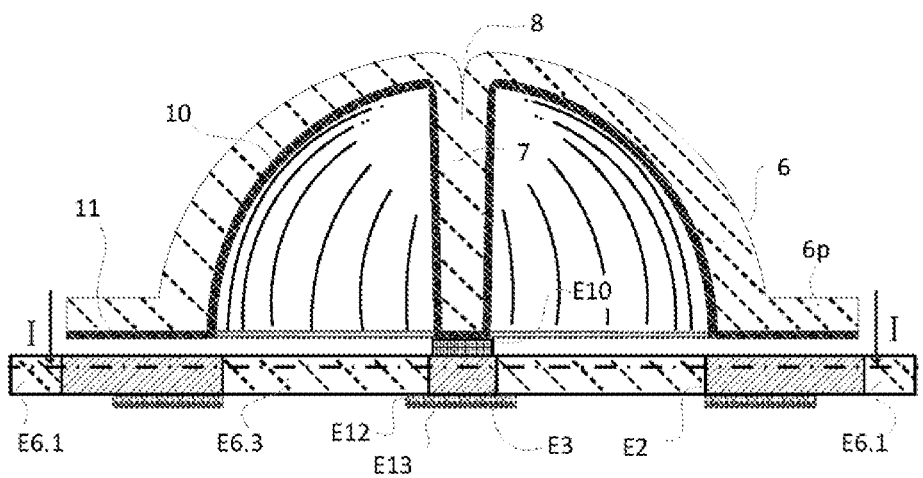
FIG.2b
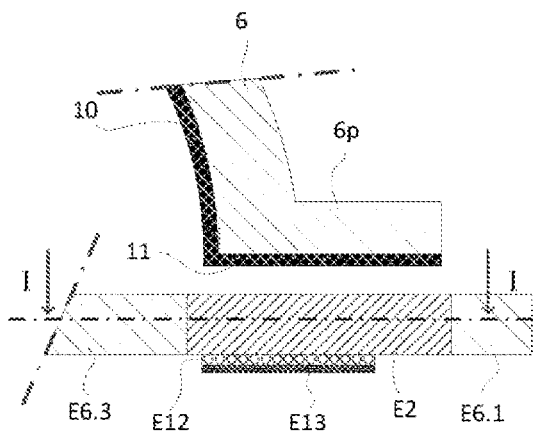 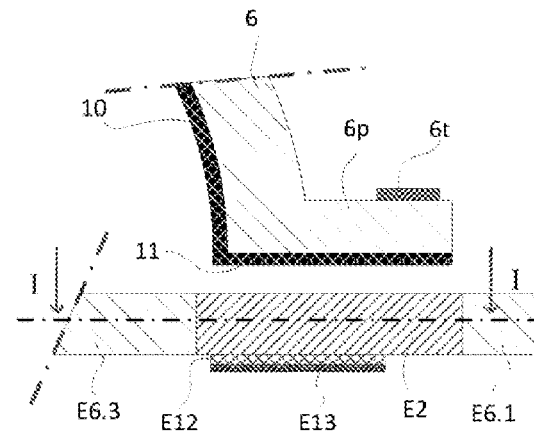
FIG.2c     FIG.2d

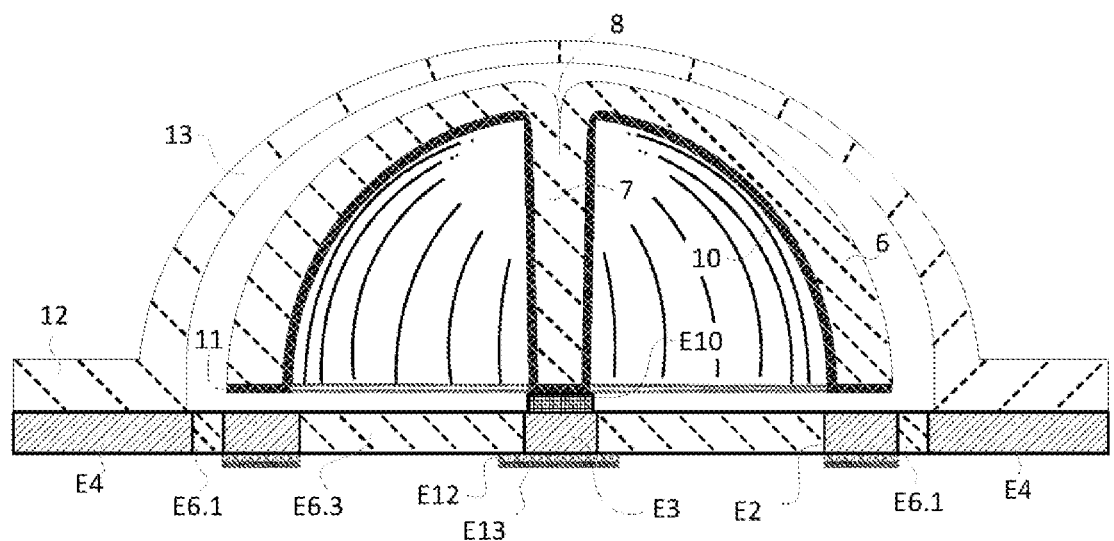
FIG.3a
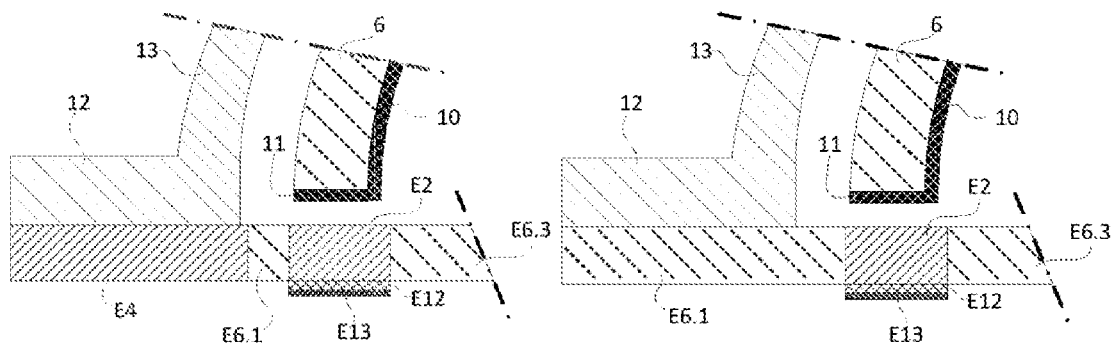
FIG.3b
FIG.3c
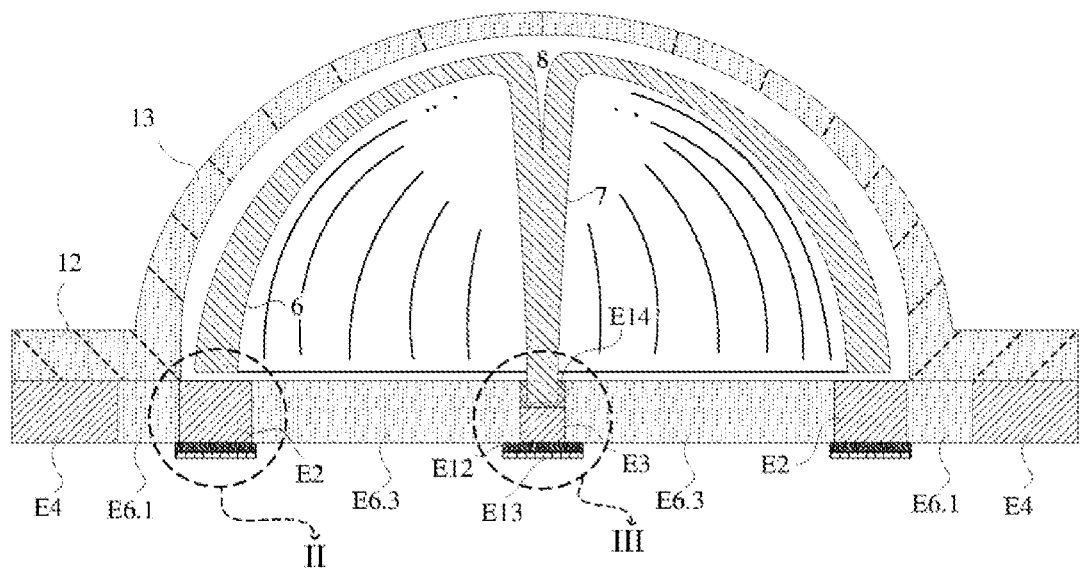
FIG.4a

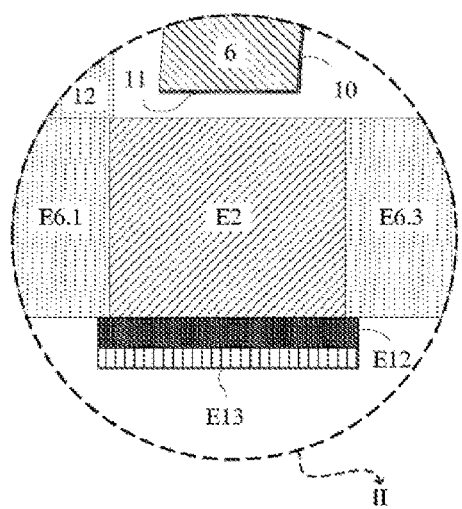
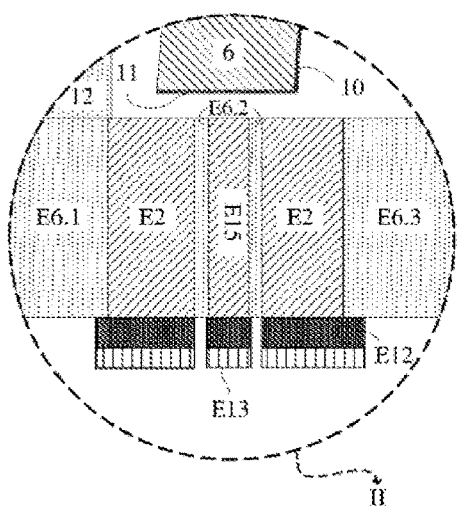
FIG.4b  FIG.4c
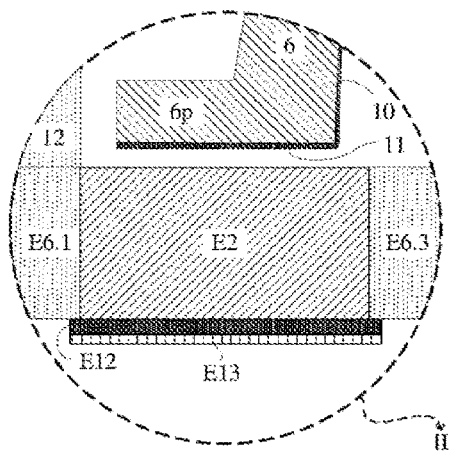
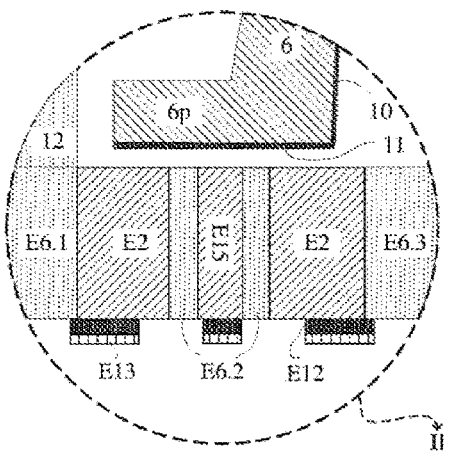
FIG.4d  FIG.4e
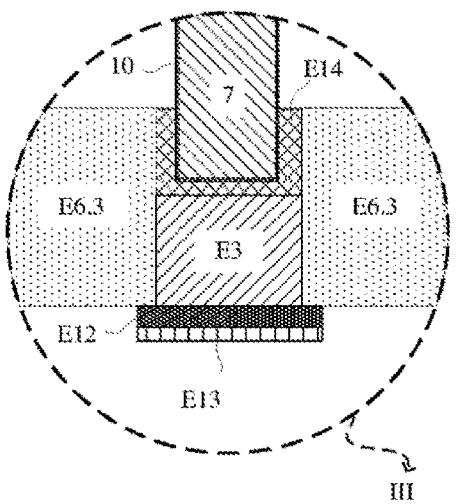
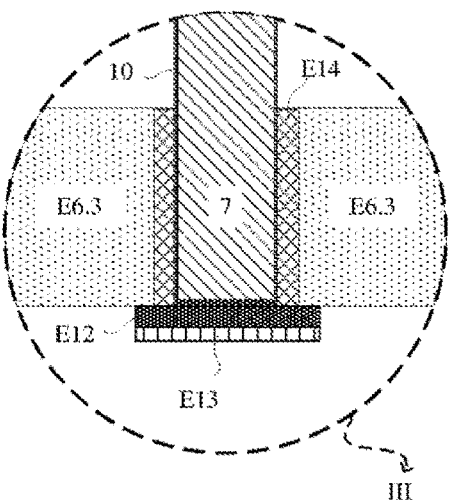
FIG.4f  FIG.4g

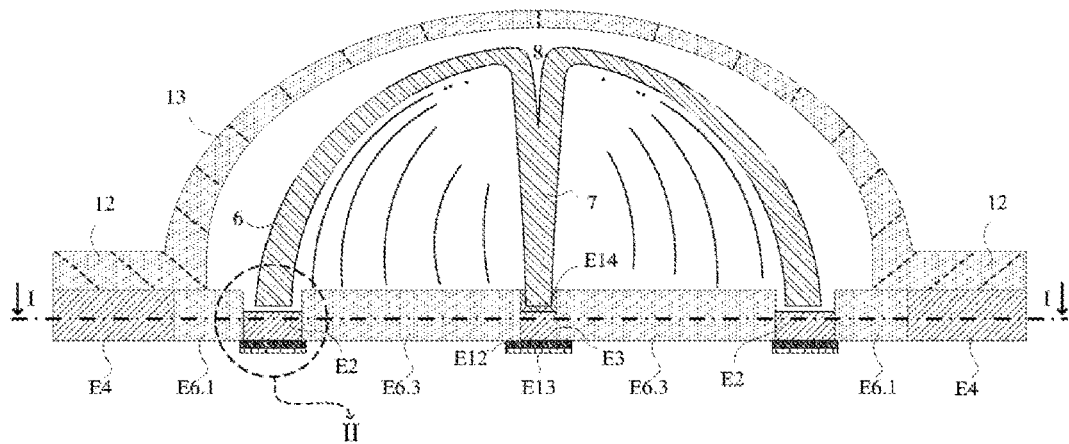
FIG.5a
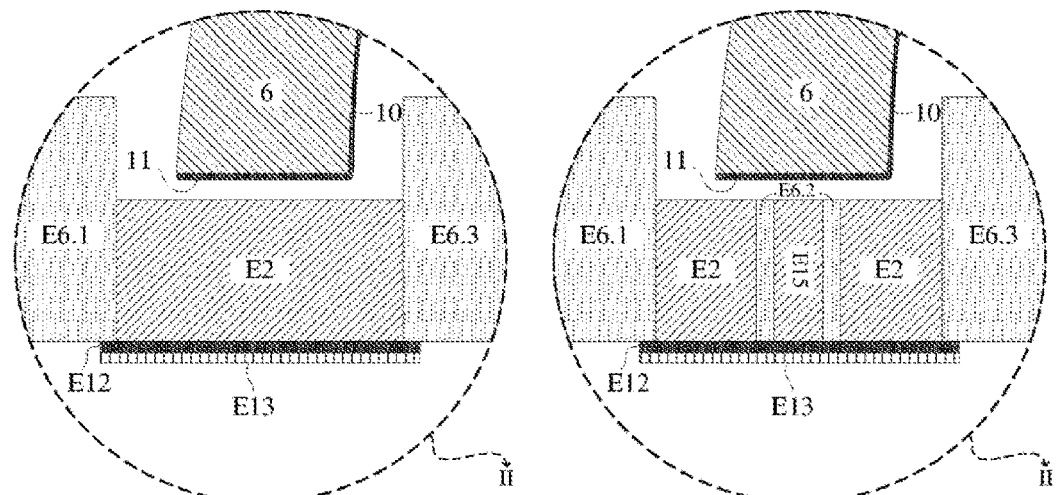
FIG.5b  FIG.5c
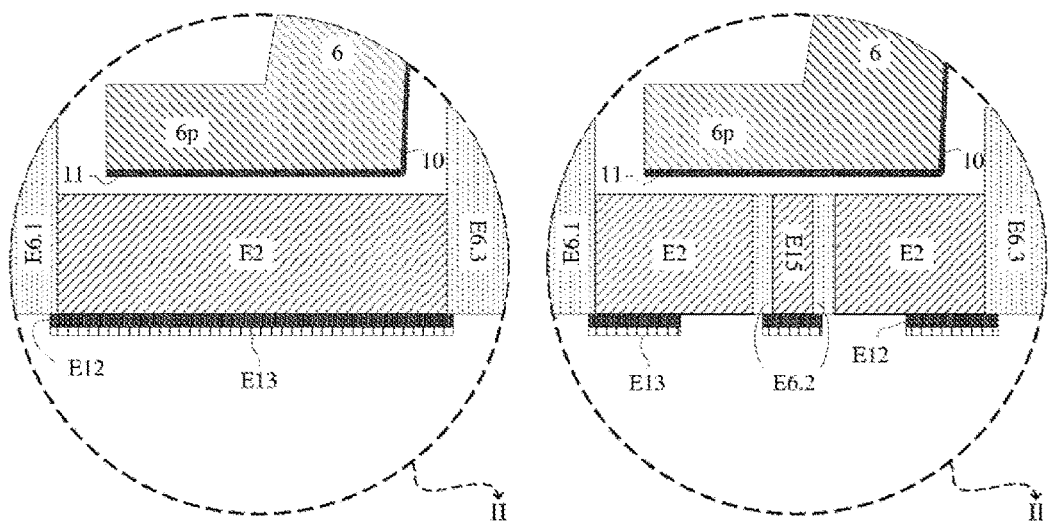
FIG.5d  FIG.5e

MICRO THREE-DIMENSIONAL SHELL RESONATOR GYROSCOPE

CROSS REFERENCE TO RELATED APPLICATIONS

This application is the national phase entry of International Application No. PCT/CN2016/110115, filed on Dec. 15, 2016, which is based upon and claims priority to Chinese Patent Applications No. 2015109636816, entitled "MICRO-GLASS HEMISPHERICAL RESONATOR GYROSCOPE AND WAFER-LEVEL FABRICATION THEREOF", No. 2016103758049, entitled "SHOCK-RESISTANT SHELL RESONATOR DEVICE", No. 2016108142175, entitled "MICRO SHELL RESONATOR DEVICE AND METHOD FOR PREPARING RESONATOR THEREOF", and No. 2016109548148, entitled "COMPOSITE SUBSTRATE AND METHOD FOR PREPARING SAME", the entire contents of which are incorporated herein by reference.

TECHNICAL FIELD

The present invention relates to a Coriolis vibratory gyroscope in the field of a micro-electromechanical system (MEMS), and in particular, to a micro three-dimensional shell resonator gyroscope.

BACKGROUND

Hemispherical resonator gyroscopes (HRG) have superior performance, however, the cost for macromachining a high-performance HRG is high. Sagem Defense Securite proposed the use of an electrode for measuring an axial motion, resulting in a small size and a relatively easy assembly process. To further reduce the cost and the size, researchers have started to focus on the miniaturization of a shell resonator gyroscope, and especially HRG. As a kernel of an MEMS shell resonator gyroscope, a micro shell resonator device determines the performance of the micro shell resonator gyroscope. The shell resonator gyroscope is a high-performance gyroscope among Coriolis vibratory gyroscopes. Limited by features and development of MEMS technology, the development of micro shell resonator gyroscope is slow. The MEMS technology features a silicon-based surface process, and high costs and low accuracy of three-dimensional MEMS technology. Due to fabrication restrictions, success in fabrication of high-performance shell resonator gyros made from a micro hemispherical resonator or a micro cylindrical resonator has not yet achieved. Compared with these two kinds of shell resonator gyroscopes, a micro-ring vibratory gyroscope is being more widely researched.

The key to implement a high-performance micro shell resonator gyroscope is fabrication of a high-performance micro shell resonator device, which is embodied in three aspects: fabrication of a high-performance micro shell resonator, fabrication and assembly of electrodes, and vacuum packaging. The micro shell resonator directly determines the performance of the device. The fabrication of the electrodes has the following two situations. In the first situation, the electrodes and the resonator are integrally fabricated and formed; and in the second situation, the electrodes are independently fabricated and then are assembled with the resonator. The key of the assembly lies in that the intervals between the electrodes and the resonator need to keep consistent, as well as their areas, thus maintaining capacitances of the electrodes and the resonator to be consistent.

The high-performance micro shell resonator gyroscope needs to operate in a high vacuum environment, and therefore the vacuum packaging becomes a crucial step in design and fabrication. However, vacuum packaging using the MEMS technology has low vacuum degree. Therefore, the interval between the electrode and the resonator needs to be appropriately increased in design in consideration of air damping. All the considerations aim at achieving a high-performance micro shell resonator device. Two of the performance indexes are most important: symmetry (specifically indicated by AO and energy loss (specifically indicated by a Q value).

SUMMARY OF THE INVENTION

To overcome the defects in the prior art, an objective of the present invention is to provide a micro three-dimensional shell resonator gyroscope, thus providing a solution to batch fabrication of a highly symmetrical micro shell resonator. The present invention provides a novel electrode and a fabrication technology thereof, thus achieving perpendicular leading-out, and achieving assembly and vacuum packaging of the micro shell resonator and the electrode.

To achieve the foregoing objective, the present invention adopts the following technical solution.

A micro three-dimensional shell resonator gyroscope includes:
 a packaging shell cover;
 a micro shell resonator; and
 a composite structure substrate into which non-planar electrodes and a conductive structure are embedded;
 where the micro shell resonator is composed of a shell and a single-ended stem located at a central axis in the shell; the non-planar electrodes are embedded into the composite structure substrate, and include conventional electrodes, the conventional electrodes including an even number of forcer electrodes and an even number of pick-off electrodes; the single-ended stem of the micro shell resonator is electrically connected with the conductive structure in the composite structure substrate by means of a conductive layer, and achieves electrical lead-out by means of a conductive lead-out layer from the backside of the composite structure substrate; the conductive structure and the non-planar electrodes are leaded out by means of the conductive lead-out layer from the backside of the composite structure substrate; and the packaging shell cover and the composite structure substrate into which the non-planar electrodes and the conductive structure are embedded are vacuum-packaged, and a getter is placed in a cavity.

Preferably, the micro three-dimensional shell resonator gyroscope further includes a fixed support structure; the bottom of the single-ended stem is flush with the bottom of a rim of the shell; the single-ended stem is inserted into the fixed support structure, and is connected to the conductive structure in the composite structure substrate by means of the conductive layer, to be leaded out.

Preferably, the bottom of the single-ended stem is not flush with the bottom of a rim of the shell; the single-ended stem is inserted into the composite structure substrate and connected to the conductive structure by means of a conductive layer, to be leaded out, or is directly inserted through a conductive through via to the bottom of the substrate.

Preferably, the bottom of the single-ended stem is flush with the bottom of a rim of the shell; the single-ended stem is inserted into the composite structure substrate into which the non-planar electrodes and the conductive structure are embedded, and is connected to the conductive structure by means of a conductive wrapping layer, to be leaded out.

Preferably, a diameter of the micro shell resonator is less than 10 mm; or a material of the micro shell resonator includes an amorphous material, an iron-nickel alloy, or an oxide; the amorphous material may include borosilicate glass, quartz glass, ultra-low expansion (ULE) titanium-silicate glass, and metallic glass; the metallic glass may be made of an amorphous material composed of metal components, including $Zr_{44}Ti_{11}Cu_{10}Ni_{10}Be_{25}$ and $Pt_{57.5}Cu_{14.7}Ni_{5.3}P_{22.5}$; the oxide may be formed of a single oxide or multiple oxides, including $Al_2O_3$, $63HfO_2.37TiO_2$, $HfO_2.WO_3.Ta_2O_5$, $Al_2O_3.TiO_2$, $55Ta_2O_5.45WO_3$, and $37Ta_2O_5.63WO_3$; the iron-nickel alloy may be composed of iron, nickel, and a small quantity of other components, including an invar alloy, a super invar alloy, and a low-expansion iron-nickel alloy, Carperter Super Invar 32-5; the thickness of the shell of the micro shell resonator longitudinally decreases from the rim to an apex, the thickness of the rim of the shell ranging from 10 μm to 800 μm; a depth-to-width ratio (a ratio of the height to the radius) of the micro shell resonator ranges from 0.5 to 1.2; a projection region of the rim of the micro shell resonator on the composite structure substrate resides between an inner edge and an outer edge of the region of the non-planar electrodes; when the micro shell resonator uses a non-conductive material, a surface of the micro shell resonator is coated or partially coated with a conductive layer, the thickness of the conductive layer being less than 100 nm.

Preferably, the rim of the shell of the micro shell resonator is provided with a flange, and a lower surface of the flange is further provided with a conductive layer, the thickness and the length of the flange being both less than 800 μm.

Preferably, the single-ended stem is one of a solid stem, a hollow stem, and a combination of a solid stem and a hollow stem.

Preferably, the composite structure substrate into which the non-planar electrodes and the conductive structure are embedded is a composite-type substrate, which is composed of a part including the non-planar electrodes and the conductive structure, an electrical isolation part, and a main body part; a material of the electrical isolation part is glass, and a material of the main body part is silicon or glass; and the material of the part including the non-planar electrodes and the conductive structure is a conductive material, the conductive material being one of highly doped conductive silicon, an invar alloy, metal, and metallic glass.

Preferably, the forcer electrodes and the pick-off electrodes in the non-planar electrodes are each a circular ring sector.

Preferably, the multiple non-planar electrodes further include a ring forcer electrode.

Preferably, the multiple non-planar electrodes further include one or more isolation electrodes.

Preferably, a coefficient of thermal expansion of a material of the packaging shell cover matches that of a material of a main body part of the composite structure substrate; a diameter of the packaging shell cover is greater than that of the micro shell resonator; the height of the packaging shell cover is greater than that of the micro shell resonator; and the packaging shell cover and the composite structure substrate are directly bonded or bonded by means of an intermediate layer, to achieve vacuum packaging.

Preferably, an interval between the micro shell resonator and the composite structure substrate ranges from 0.5 μm to 100 μm, and an optimal interval is determined by the dimension of the micro shell resonator and a vacuum degree achieved after vacuum packaging.

Preferably, the getter is placed in the cavity before vacuum packaging, resides on the packaging shell cover or on the composite structure substrate, and is activated after vacuum packaging.

A method for fabricating a micro shell resonator includes the following steps:

step 1: machining on a substrate wafer to form a cavity with pillars;

step 2: introducing a foaming agent as a solution or a suspension into the cavity on the substrate wafer;

step 3: heating to remove water from the solution or the suspension in the cavity on the substrate wafer, to leave the foaming agent;

step 4: sealing the cavity through bonding between the substrate wafer obtained in the previous step and a structural wafer, to form a bonded wafer; and step 5: heating the bonded wafer obtained in the previous step above a softening point or a melting point of the structural wafer, to form a micro shell resonator.

Preferably, in step 1, the machining is one of micro-electrical discharge machining, micro-ultrasonic machining, dry etching, and wet etching; or a combination of wet etching and another machining.

Preferably, in step 2, the foaming agent is a substance which decomposes in a high temperature to releases a gas, including one of titanium hydride, zirconium hydride, calcium carbonate, magnesium carbonate, barium carbonate, strontium carbonate, and calcium bicarbonate, or a mixture thereof.

Preferably, in step 3, the foaming agent may be added into the cavity by: first successively adding one solution and another solution for a chemical reaction to form the foaming agent, and then heating to remove water; or adding multiple solutions together for a reaction to form the foaming agent, and then heating to remove water; or adding a solution or suspension and then heating to remove water, leaving the foaming agent.

Preferably, in step 4, a material of the structural wafer includes an amorphous material, an iron-nickel alloy, or an oxide; the amorphous material includes borosilicate glass, quartz glass, ultra-low expansion (ULE) titanium-silicate glass, and metallic glass; the metallic glass is made of an amorphous material composed of metal components, including $Zr_{44}Ti_{11}Cu_{10}Ni_{10}Be_{25}$ and $Pt_{57.5}Cu_{14.7}Ni_{5.3}P_{22.5}$; the oxide may be formed of a single oxide or multiple oxides, including $Al_2O_3$, $63HfO_2.37TiO_2$, $HfO_2.WO_3.Ta_2O_5$, $Al_2O_3.TiO_2$, $55Ta_2O_5.45WO_3$, $37Ta_2O_5.63WO_3$; the iron-nickel alloy is composed of iron, nickel, and a small quantity of other components, including an invar alloy, a super invar alloy, and a low-expansion iron-nickel alloy, Carperter Super Invar 32-5.

A method for fabricating a composite structure substrate includes the followings steps:

step 1: forming a cavity on a silicon substrate wafer through dry etching, the cavity including silicon pillars therein, and having a depth ranging from 100 μm to 1100 μm;

step 2: anodicaly bonding a glass wafer to one side of the silicon substrate wafer with the cavity, to form a bonded wafer, the bonding occurring in a vacuum environment to obtain the bonded wafer;

step 3: placing the bonded wafer in a heating furnace, a heating temperature being higher than a softening point of the glass wafer; maintaining the temperature till the whole cavity is filled with glass; and then lowering the temperature to room temperature, to form a reflowed wafer;

step 4: completely removing a pure glass layer from the reflowed wafer by means of thinning, grinding, and chemical-mechanical polishing;

step 5: removing, through dry etching or wet etching, the silicon pillars surrounded with glass, to form a second cavity; and step 6: machining an embedded conductive part into the second cavity on the silicon substrate wafer obtained in step 5, and removing a bottom silicon layer till glass reflowing into the cavity is exposed, to obtain the composite structure substrate.

If a material of the embedded conductive part is metallic glass in step 6, the following steps are performed:

step a1: bonding a metallic glass wafer to the silicon substrate wafer obtained in step 5, to form a second bonded wafer, the bonding occurring in a vacuum environment;

step b1: placing the second bonded wafer in a heating furnace under a nitrogen or inert gas atmosphere and at a temperature higher than the softening point of the metallic glass wafer; maintaining the temperature till the whole second cavity is filled with the metallic glass; and then lowering the temperature to room temperature, to form a second reflowed wafer; and step c1: removing a pure metallic glass layer and a bottom silicon layer from the second reflowed wafer by means of thinning, grinding, and chemical-mechanical polishing, till the glass reflowing into the cavity is exposed, to obtain the composite structure substrate.

If a material of the embedded conductive part is an invar alloy or a super invar alloy in step 6, the following steps are performed:

step a2: electroplating the silicon substrate wafer obtained in step 5 with the invar alloy or super invar alloy, to fill the second cavity; and step b2: removing the invar alloy or super invar alloy and a bottom silicon layer from the silicon substrate wafer obtained in the previous step by means of thinning, grinding, and chemical-mechanical polishing, till glass reflowing into the cavity is exposed, to obtain the composite structure substrate.

A method for fabricating a micro three-dimensional shell resonator gyroscope includes the following steps:

(1) wafer-level fabrication of a glass micro shell resonator by a foaming process, including the following steps:

step 1: dry-etching a silicon wafer to form a dry-etched silicon wafer, such that a cylindrical cavity internally including a silicon cylinder is formed in the dry-etched silicon wafer; and adding a foaming agent into the cylindrical cavity;

step 2: bonding a glass wafer to an upper surface of the dry-etched silicon wafer formed after dry-etching the silicon wafer in the previous step, and to an upper surface of the silicon cylinder in the cylindrical cavity, to form a bonded wafer;

step 3: placing the bonded wafer obtained in the previous step in a high-temperature heating furnace to evenly heat the bonded wafer, a heating temperature being higher than a glass softening point; where the foaming agent decomposes in the high temperature to generate a gas, such that a gas pressure in the cylindrical cavity sharply increases; driven by a gas pressure difference and surface tension, the softened glass forms a micro shell resonator; glass at the silicon cylinder forms a single-ended stem; and then the temperature is rapidly lowered to room temperature;

step 4: evenly coating a surface of the bonded wafer with the micro shell resonator obtained in the previous step with a thick protective layer, the protective layer being an organic material, an inlay, or paraffin;

step 5: grinding and chemical-mechanically polishing the bonded wafer with the micro shell resonator, evenly coated with a thick protective layer on the upper surface, obtained in the previous step, to remove a planar part of the bonded wafer and reserve the micro shell resonator; and step 6: evenly coating a part or a whole of an inner surface of the micro shell resonator reserved in the foregoing step with a conductive layer;

(2) wafer-level fabrication of a silicon non-planar electrode by a thermal reflow process, including the following steps:

step 7: dry-etching a highly doped silicon wafer to form a silicon wafer, such that a cylindrical cavity internally including silicon pillars is formed in the silicon wafer, the silicon pillar serving as a silicon non-planar electrode and a silicon lead-out passage;

step 8: bonding, in a vacuum, a glass wafer to an upper surface of the dry-etched silicon wafer and to an upper surface of the silicon pillar in the cylindrical cavity, to form a bonded wafer;

step 9: placing the bonded wafer obtained in the previous step 8 in a heating furnace to heat the bonded wafer, a heating temperature being higher than a glass softening point; maintaining the temperature till the whole cylindrical cavity is filled with softened glass; and then lowering the temperature to room temperature, to form a three-layer reflowed wafer in which a full-glass structure layer is formed on the upper part, a composite structure layer into which the silicon non-planar electrode and the silicon lead-out passage are embedded is formed in the middle, and a full-silicon substrate structure layer is formed on the bottom;

step 10: grinding and chemical-mechanically polishing the reflowed wafer, to remove the upper full-glass structure layer and the bottom full-silicon substrate structure layer, leaving the intermediate composite structure layer into which the silicon non-planar electrode and the silicon lead-out passage are embedded; and step 11: arranging a metal lead on a lower surface of the composite structure layer, coating an upper surface with a sacrificial layer, and arranging a metal adhesive layer on the silicon lead-out passage;

(3) assembly of the glass micro shell resonator with the silicon non-planar electrode, including the following steps:

step 12: bonding the composite structure layer arranged with the metal wire, coated with the sacrificial layer on the upper surface, and arranged with the metal adhesive layer on the silicon lead-out passage obtained in step 11 and the glass micro shell resonator evenly coated with the conductive layer obtained in step 6, to form a whole structure; and step 13: removing the protective layer and the upper-surface sacrificial layer from the whole structure; and (4) vacuum packaging, including the following steps:

step 14: fabricating a glass packaging shell cover by a foaming process; and step 15: bonding the glass packaging shell cover to the composite structure substrate in a glass micro shell resonator gyroscope obtained in step 13, to achieve vacuum packaging.

The structure of the present invention has the following advantages:

1. A rim of a micro shell resonator is provided with a flat flange, and the flange or a modulation layer on the flange may be trimmed by using laser, thus increasing symmetry of the structure, reducing a frequency splitting value of an operating mode, and improving the performance of the device. In addition, as the dimension of the flange is adjusted, an operating frequency is also adjusted. The length and the thickness of the flange are adjustable, and the length may be in a range from 10 μm to 800 μm. Thus, for a millimeter-sized micro shell resonator, an area of interaction between electrodes and resonator is greatly increased, and capacitance is increased accordingly.

2. The micro shell resonator uses a material of a low coefficient of thermal expansion, which facilitates to reduce the thermoelastic loss and increase the Q value of the resonator. If the micro shell resonator uses a conductive material, a conductive layer is not required, which is beneficial for reducing the surface loss.

3. The thickness of the shell of the micro shell resonator longitudinally decreases from the rim to an apex. In this case, the effective mass is relatively large, which is beneficial for ensuring low thermal-mechanical noise.

4. The composite structure substrate has the following functions: first, supporting the micro shell resonator or supporting a planar electrode; secondly, including a non-planar electrode, the non-planar electrode forming a part of the composite structure substrate, which indicates that the composite structure substrate can act to drive and detect the micro shell resonator; thirdly, including a conductive structure or a conductive via hole, thus achieving perpendicular leading-out; and finally, most importantly, vacuum packaging, where the composite structure substrate serves as a part of a packaging cover. In conclusion, the composite structure substrate integrates four functions: driving and detection, supporting, perpendicular leading-out, and vacuum packaging.

5. The non-planar electrodes or the planar electrodes include forcer electrodes and pick-off electrodes, and also a ring forcer electrode; and may further include an isolation electrode, where the isolation electrode is used to isolate crosstalk between the forcer electrode and the pick-off electrode, crosstalk between the forcer electrodes, and crosstalk between the pick-off electrodes.

The method for fabricating a micro shell resonator in the present invention has the following advantages:

1. The micro shell resonator fabricated by a foaming process is highly symmetrical, and has angstrom-level surface roughness.

2. A diameter of the micro shell resonator can be controlled below 1 cm. The method can also be used to fabricate a shell resonator having a diameter of greater than 1 cm or a hemispherical resonator having a diameter greater than 1 cm.

3. In the fabrication method, a height and a depth-to-width ratio of the micro shell resonator can be adjusted by adjusting the amount of the foaming agent, and a micro shell resonator having a high depth-to-width ratio (1 or higher) can be fabricated. A precession factor of the micro shell resonator can be adjusted. In addition, the high depth-to-width ratio facilitates to reduce an energy loss of the resonator, thus increasing the Q value and improving the performance of the device. Therefore, a hemispherical shell resonator can also be fabricated.

4. The micro shell resonator with the high depth-to-width ratio has a resonance frequency lower than that of a micro shell resonator with a low depth-to-width ratio, and more easily results in a large time decay constant, which is crucial for a high-performance micro shell resonator.

5. In a process of fabricating the micro shell resonator, the foaming agent is introduced into a cavity of a substrate wafer as a solution or suspension. In this way, the foaming agent can be evenly distributed, the consistency of shell resonators in the same batch can be improved, and industrial production can be easily implemented.

The method for fabricating a composite substrate in the present invention has the following advantages:

1. The present invention utilizes one of an invar alloy and a super invar alloy as the material of an embedded conductive part. Such materials have desirable conductivity, and coefficients of thermal expansion matching or approaching those of a glass part and a silicon part. Compared with a copper material, these materials can greatly enhance reliability of the composite substrate.

2. Filling a second cavity with metallic glass by using reflow technology has less difficulty in comparison with filling the second cavity through electroplating, thus simplifying the operation.

3. The invar alloy, the super invar alloy, and the metallic glass (having a resistance lower than 0.001 Ω·cm) have better conductivity than highly doped silicon (0.001 Ω·cm). These materials have some advantages in radio frequency application.

BRIEF DESCRIPTION OF THE DRAWINGS

FIG. 2a is a sectional diagram of an assembly of a micro shell resonator without a flange and a composite structure substrate; FIG. 2b is a sectional diagram of an assembly of a micro shell resonator with a flange and a composite structure substrate; FIG. 2c is a partial diagram of an assembly of a micro shell resonator with a flange and a composite structure substrate; and FIG. 2d is a partial diagram of an assembly of a micro shell resonator provided with a modulation layer on a flange and a composite structure substrate;

FIG. 3 is a schematic sectional diagram of a micro shell resonator gyroscope, where FIG. 3a is a schematic sectional diagram of a whole of the micro shell resonator gyroscope; FIG. 3b is a schematic partial diagram of the micro shell resonator gyroscope, which shows that a main body part of the composite structure substrate is silicon; and FIG. 3c is a schematic partial diagram of the micro shell resonator gyroscope, which shows that a main body part of the composite structure substrate is glass;

FIG. 4 is a schematic sectional diagram of a micro shell resonator gyroscope, showing that the bottom of a single-ended stem of a micro shell resonator is not flush with the bottom of a rim of a shell, and the single-ended stem is inserted into the composite structure substrate, where FIG. 4a is a schematic sectional diagram of a whole of the micro shell resonator gyroscope; FIG. 4b to FIG. 4e are four schematic diagrams of a part II of the micro shell resonator gyroscope in FIG. 4a, showing two situations of the micro shell resonator: having a flange and not having a flange, and showing two situations of a non-planar electrode: including a ring forcer electrode and not including a ring forcer electrode; and FIG. 4f to FIG. 4g are two schematic diagrams of a part III of the micro shell resonator gyroscope in FIG. 4a, showing two situations in which the single-ended stem of the micro shell resonator is inserted into the composite structure substrate;

FIG. 5 is a schematic sectional diagram of a micro shell resonator gyroscope, showing that the bottom of a single-ended stem of a micro shell resonator is flush with the bottom of a rim of a shell, and the single-ended stem is inserted into the composite structure substrate, where FIG. 5a is a schematic sectional diagram of a whole of the micro shell resonator gyroscope; FIG. 5b to FIG. 5e are four schematic diagrams of a part II of the micro shell resonator gyroscope in FIG. 5a, showing two situations of the micro shell resonator: having a flange and not having a flange, and showing two situations of a non-planar electrode: including a ring forcer electrode and not including a ring forcer electrode;

DETAILED DESCRIPTION OF THE INVENTION

The present invention is further explained below with reference to embodiments and accompanying drawings. The following embodiments are merely used for describing the present invention, and are not intended to limit the scope of the present invention.

Embodiment 1

Figure 1:
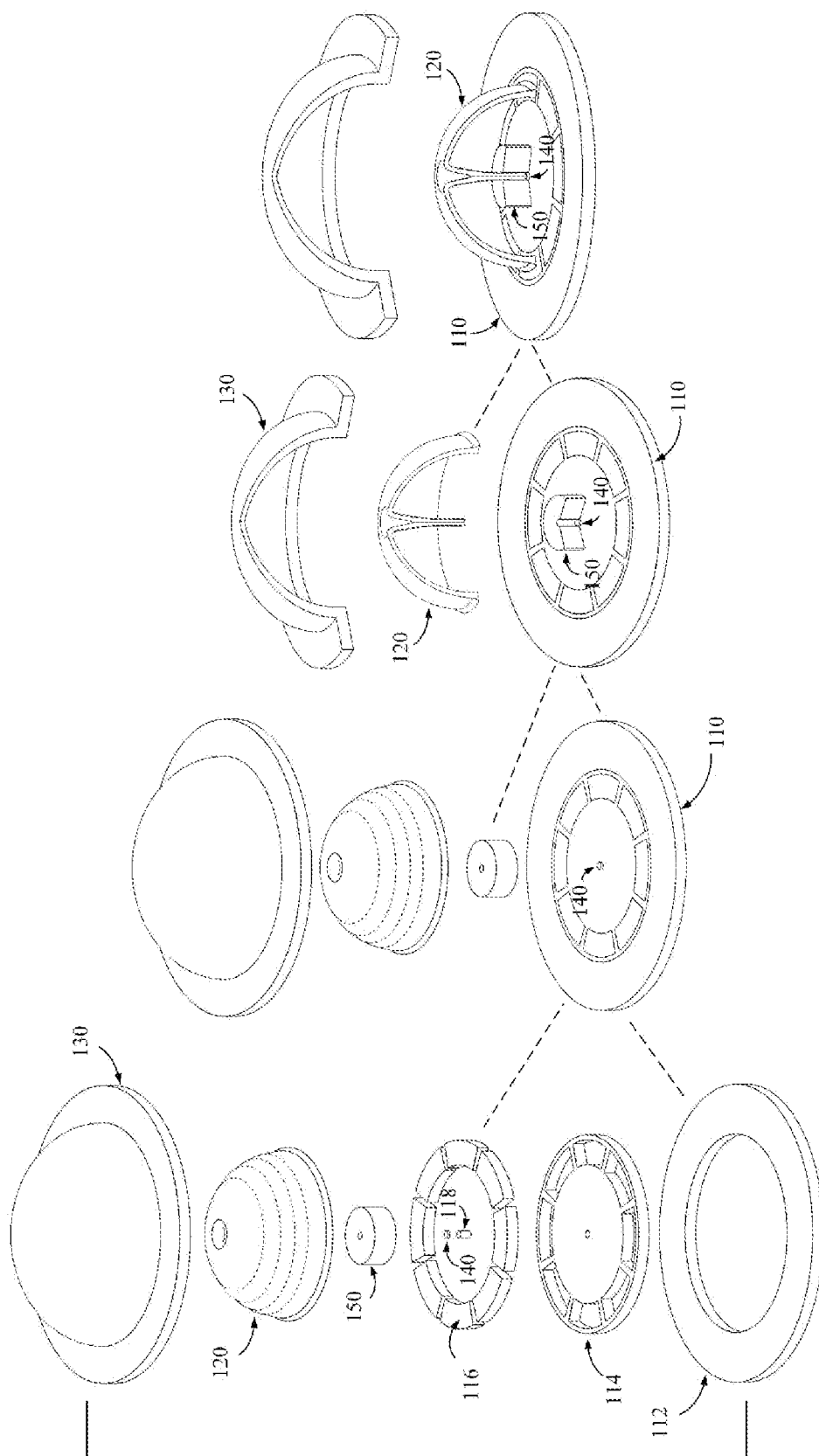
FIG. 1 is a schematic three-dimensional diagram of a micro shell resonator gyroscope.
Figure 6A:
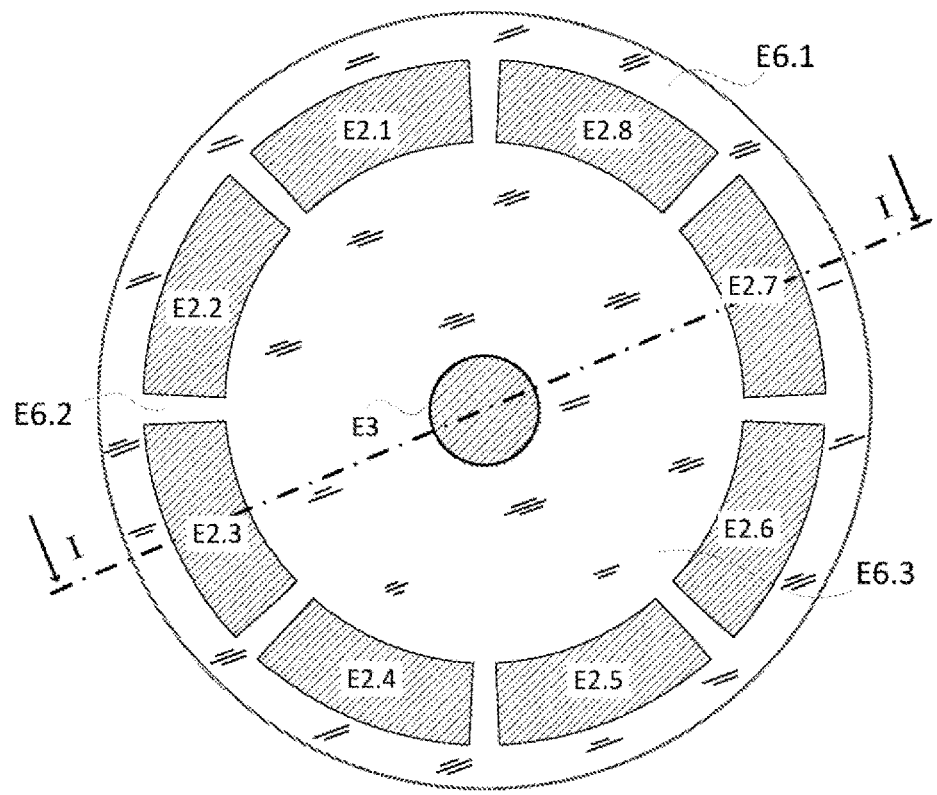
FIG. 6a to FIG. 6h are schematic diagrams of non-planar electrodes.
Figure 6B:
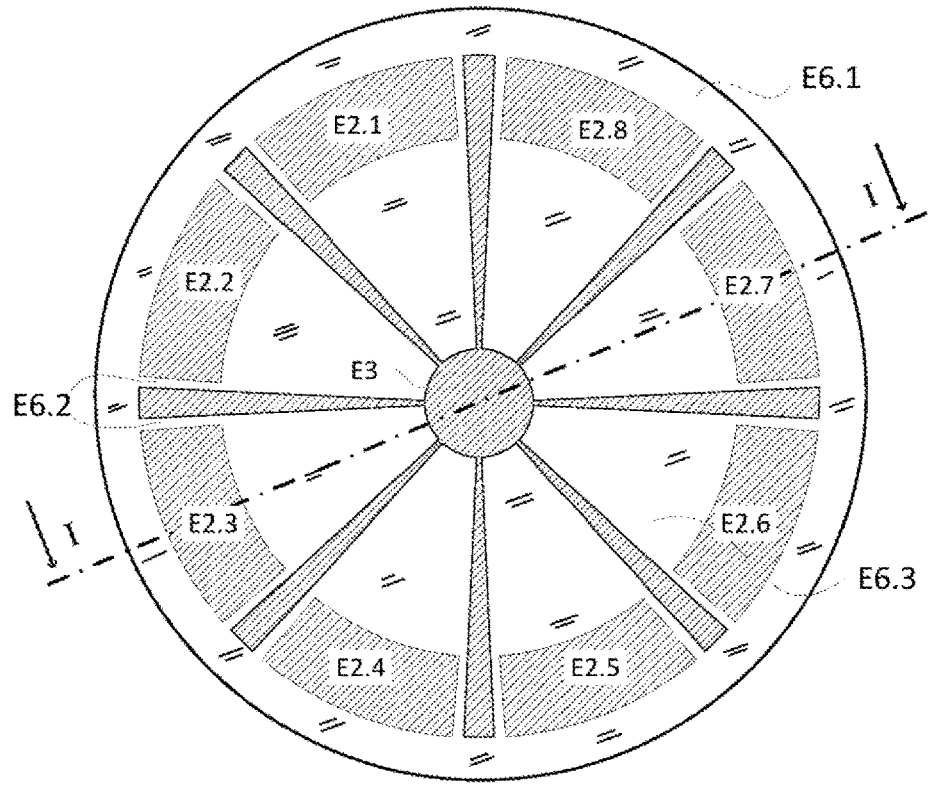
Figure 6C:
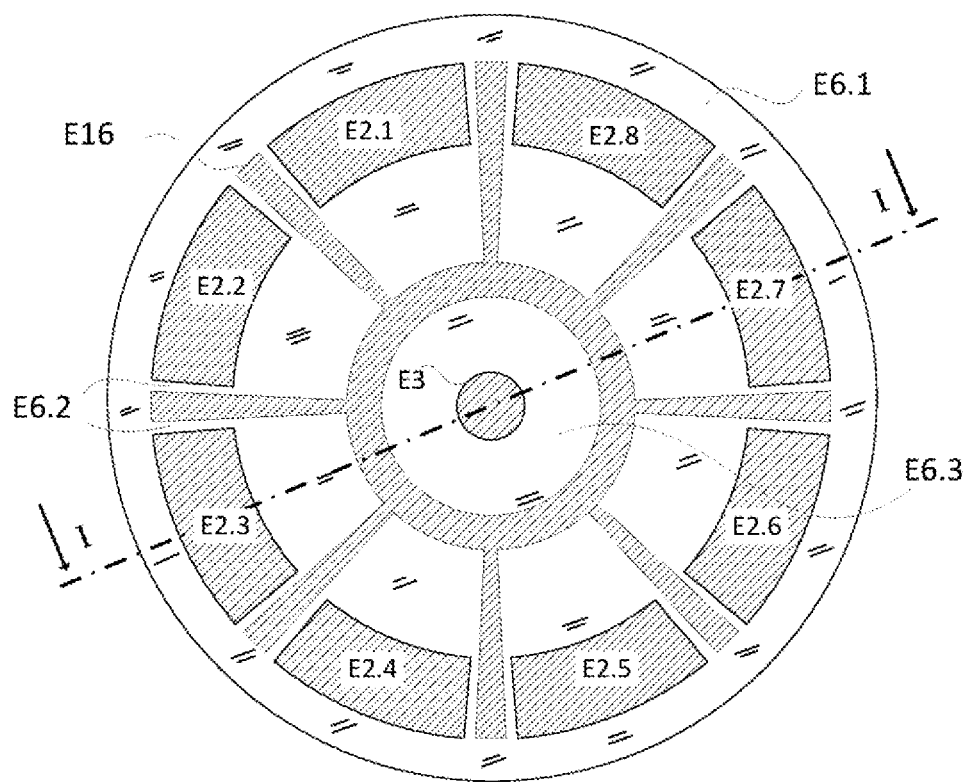
Figure 6D:
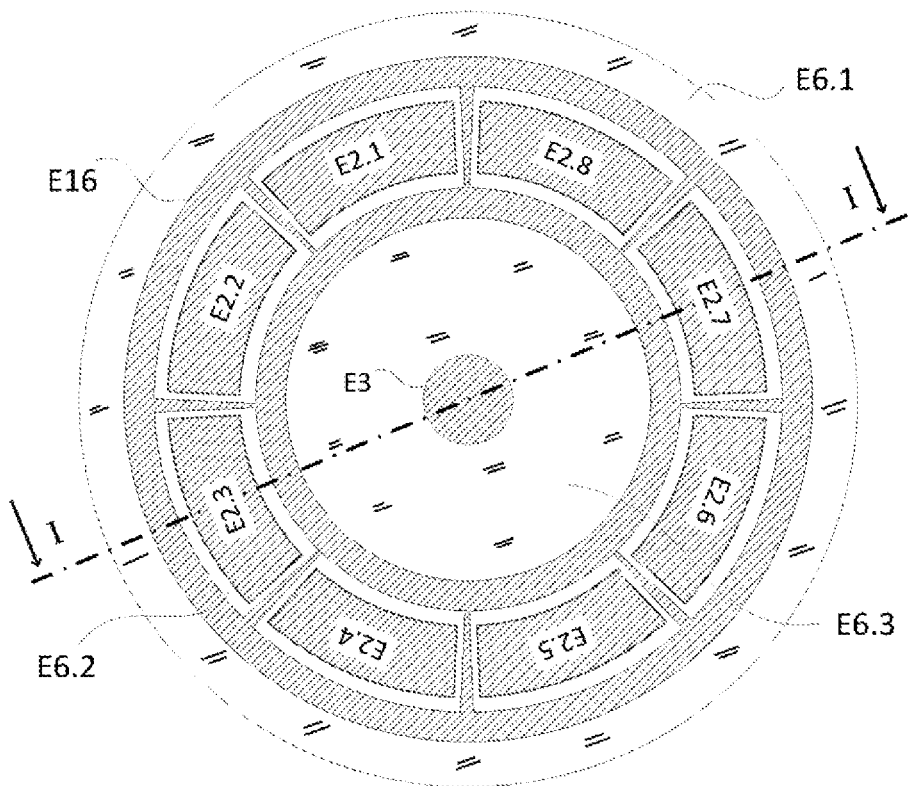
Figure 6E:
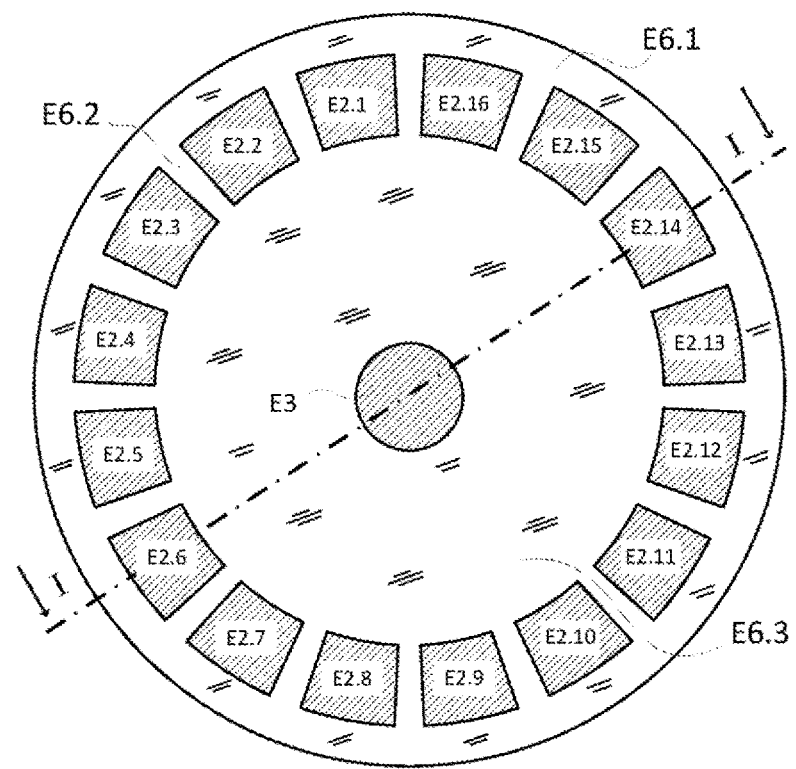
Figure 6F:
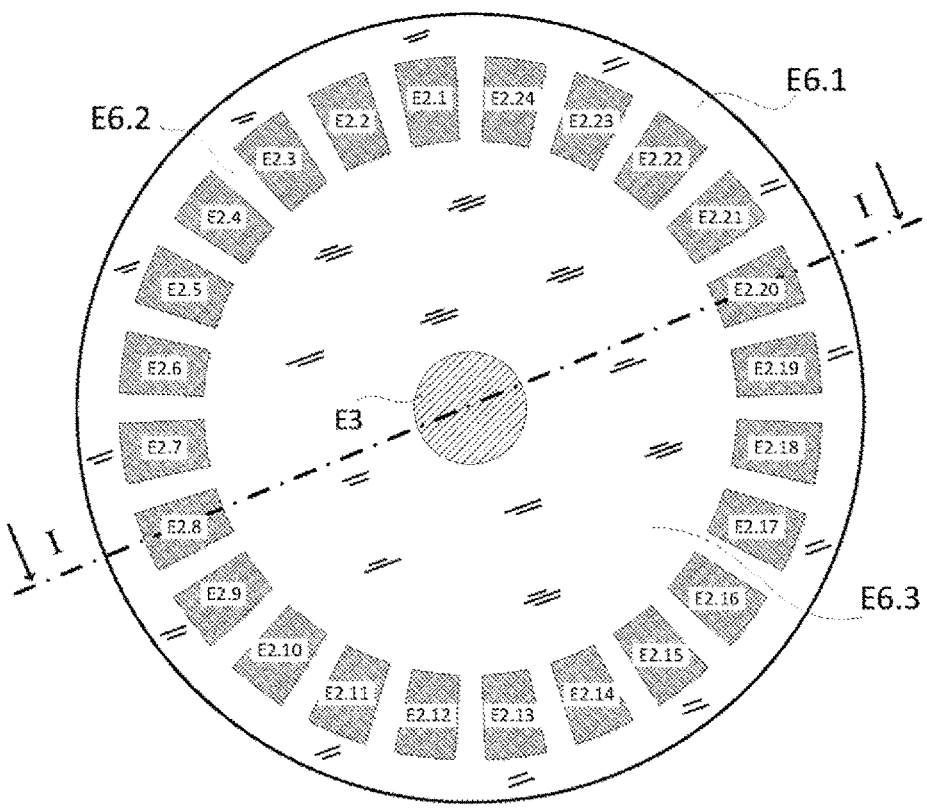
Figure 6G:
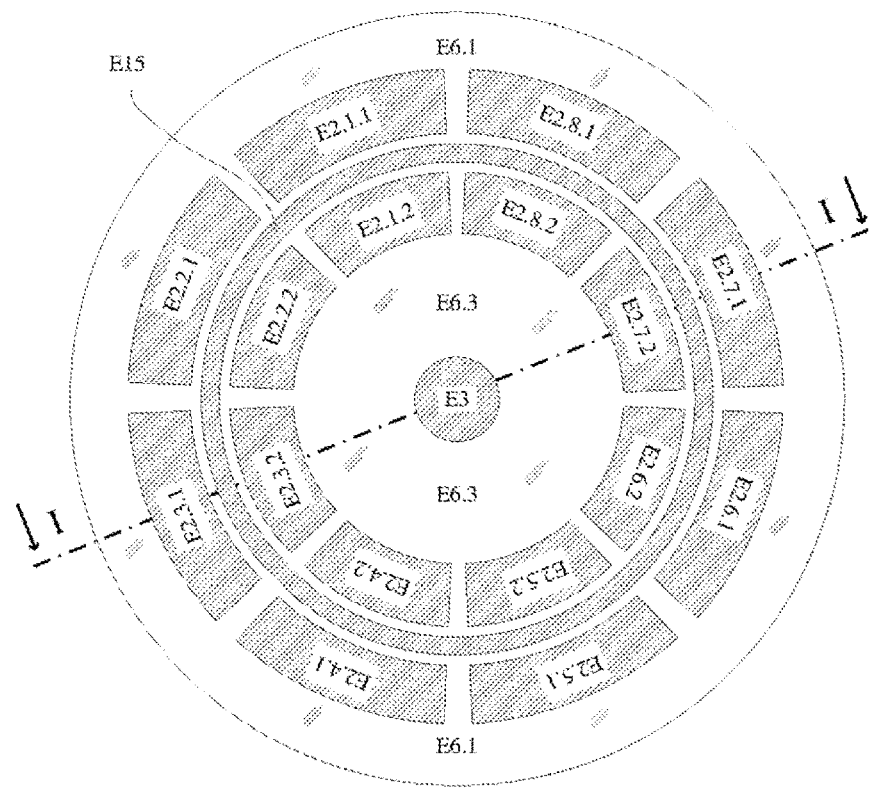
Figure 6H:
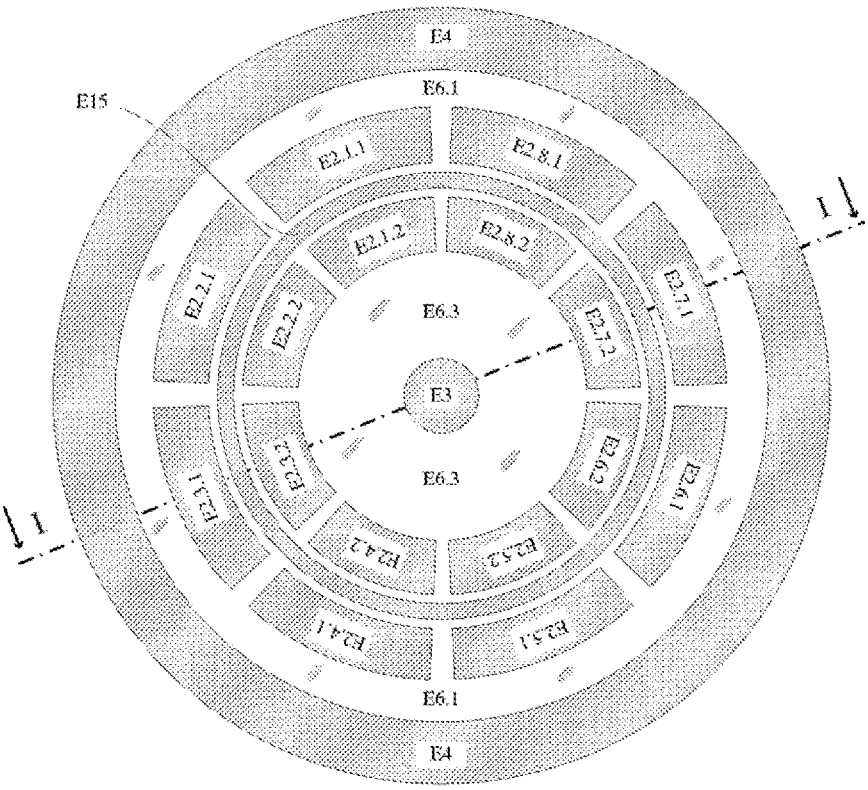
Figure 7A:
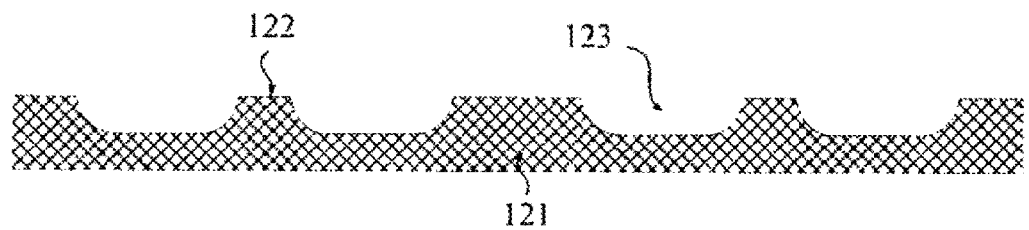
FIG. 7a to FIG. 7e are flowcharts of a fabrication process of a micro shell resonator.
Figure 7B:
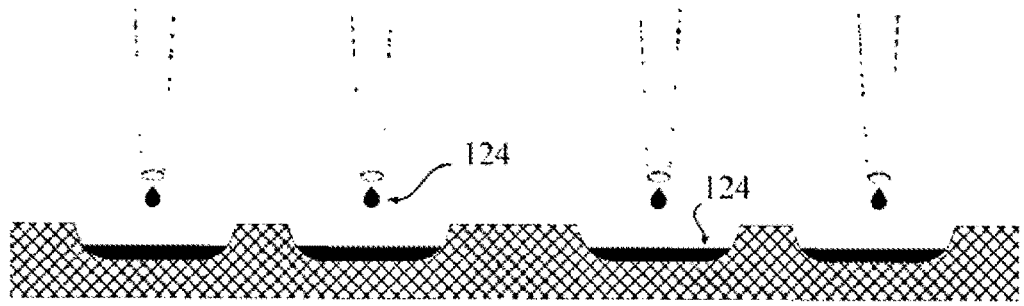
Figure 7C:
Figure 7D:
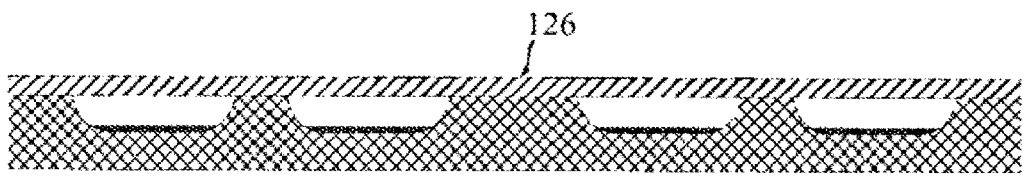
Figure 7E:
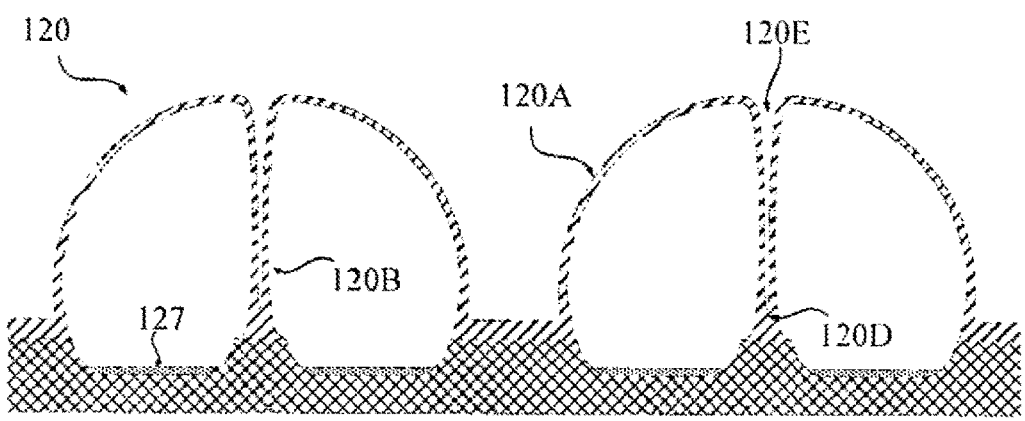

As shown in FIG. 1, a micro three-dimensional shell resonator gyroscope 100 includes:

a packaging shell cover 130;
a micro shell resonator 120;
a fixed support structure 150; and
a composite structure substrate 110 into which non-planar electrodes 116 and a conductive structure 118 are embedded.

The micro shell resonator 120 is composed of a shell and a single-ended stem located at a central axis in the shell. The bottom of the single-ended stem is flush with the bottom of a rim of the shell. The single-ended stem is inserted into the fixed support structure 150; and is connected to the conductive structure 118 in the composite structure substrate 110 by means of a conductive layer 140, to be leaded out. The non-planar electrodes 116 are embedded into the composite structure substrate 110, and include conventional electrodes, the conventional electrodes including an even number of forcer electrodes and an even number of pick-off electrodes. The conductive structure 118 and the non-planar electrodes 116 are leaded out by means of a conductive lead-out layer from the backside of the composite structure substrate 110. The packaging shell cover 130 and the composite structure substrate 110 are packaged, so as to form a vacuum interior, and a getter is placed in the interior.

A diameter of the micro shell resonator 120 ranges from 1 mm to 10 mm. A material of the micro shell resonator 120 is one selected from the group consisting of an amorphous material, an iron-nickel alloy, or an oxide. The amorphous material is one selected from the group consisting of borosilicate glass, quartz glass, ultra-low expansion (ULE) titanium-silicate glass, and metallic glass. The metallic glass is made of an amorphous material composed of metal components, such as $Zr_{44}Ti_{11}Cu_{10}Ni_{10}Be_{25}$ and $N_{57.5}Cu_{14.7}Ni_{5.3}P_{22.5}$. The oxide is formed of a single oxide or multiple oxides, such as $Al_2O_3$, $63HfO_2.37TiO_2$, $HfO_2.WO_3.Ta_2O_5$, $Al_2O_3.TiO_2$, $55Ta_2O_5.45WO_3$, and $37Ta_2O_5.63WO_3$. The iron-nickel alloy is composed of iron, nickel, and a small quantity of other components, such as an invar alloy, a super invar alloy, and a low-expansion iron-nickel alloy Carperter Super Invar 32-5. The shell thickness of the micro shell resonator 120 longitudinally decreases from the rim to an apex, and the rim thickness of the shell ranges from 10 μm to 800 μm. A depth-to-width ratio (a ratio of the height to the radius) of the micro shell resonator 120 ranges from 0.5 to 1.2. A projection region of the rim of the micro shell resonator 120 on the composite structure substrate 110 resides between an inner edge and an outer edge of the region of the non-planar electrodes. When the micro shell resonator 120 is made from a non-conductive material, a surface of the micro shell resonator 120 is coated or partially coated with a conductive layer, and the thickness of the conductive layer ranges from 0.5 nm to 100 nm.

The shell rim of the micro shell resonator 120 is provided with a flange, and a lower surface of the flange is coated with a conductive layer, and the thickness and the length of the flange both range from 10 μm to 800 μm.

The single-ended stem is one of a solid stem, a hollow stem, and a combination of a solid stem and a hollow stem.

The composite structure substrate 110 into which the non-planar electrodes 116 and the conductive structure 118 are embedded is a composite-type substrate, which is composed of a part including the non-planar electrodes 116 and the conductive structure 118, an electrical isolation part, and a main body part. A material of the electrical isolation part is glass, and a material of the main body part is silicon or glass. The material of the part including the non-planar electrodes 116 and the conductive structure 118 is a conductive material, the conductive material being one of highly doped conductive silicon, an invar alloy, metal, and metallic glass.

The forcer electrodes and the pick-off electrodes in the non-planar electrodes 116 are each a circular ring sector. The multiple non-planar electrodes 116 further include a ring forcer electrode. The multiple non-planar electrodes further include one or more isolation electrodes.

A coefficient of thermal expansion of a material of the packaging shell cover 130 matches that of a material of the main body part of the composite structure substrate 110. A diameter of the packaging shell cover 130 is greater than that of the micro shell resonator 120. The height of the packaging shell cover 130 is greater than that of the micro shell resonator 120. The packaging shell cover 130 and the composite structure substrate 110 are directly bonded or bonded by means of an intermediate layer, to achieve vacuum packaging.

An interval between the micro shell resonator 120 and the composite structure substrate 110 ranges from 0.5 μm to 100 μm, and an optimal interval is determined by the dimension of the micro shell resonator 120 and a vacuum degree achieved after vacuum packaging.

The getter is placed in the cavity before vacuum packaging, resides on the packaging shell cover 130 or on the composite structure substrate 110, and is activated after vacuum packaging.

Embodiment 2

Figures 1, 8A:
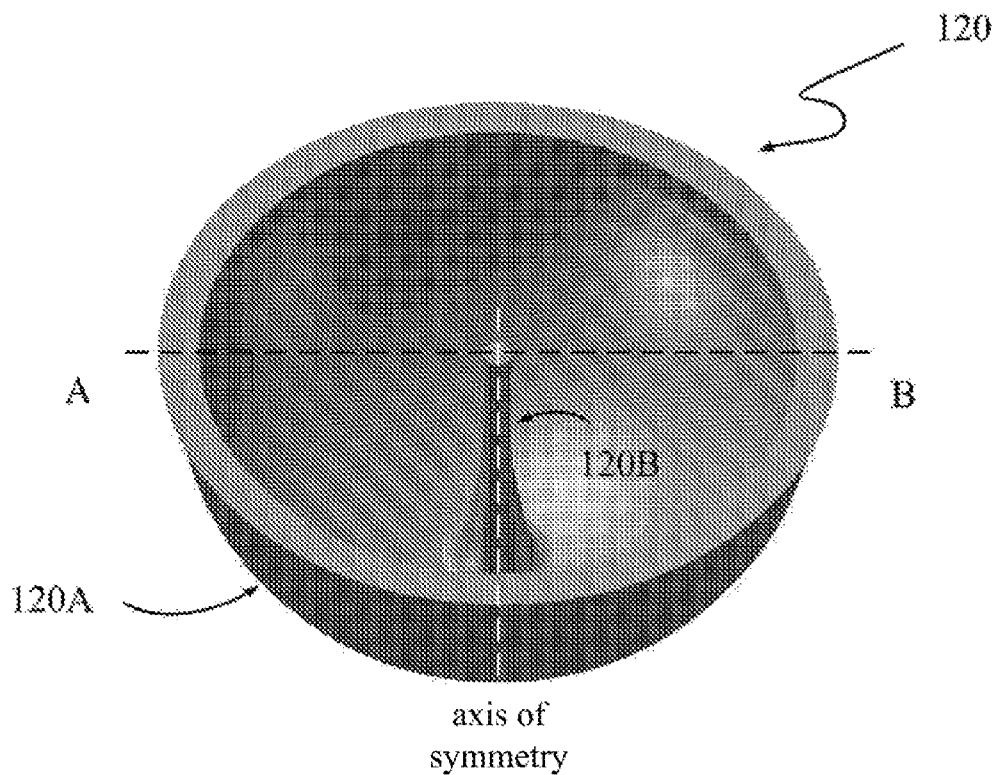
FIG. 8a to FIG. 8c are schematic diagrams of three micro shell resonators based on the fabrication process of FIG. 7.
Figures 2, 8A:
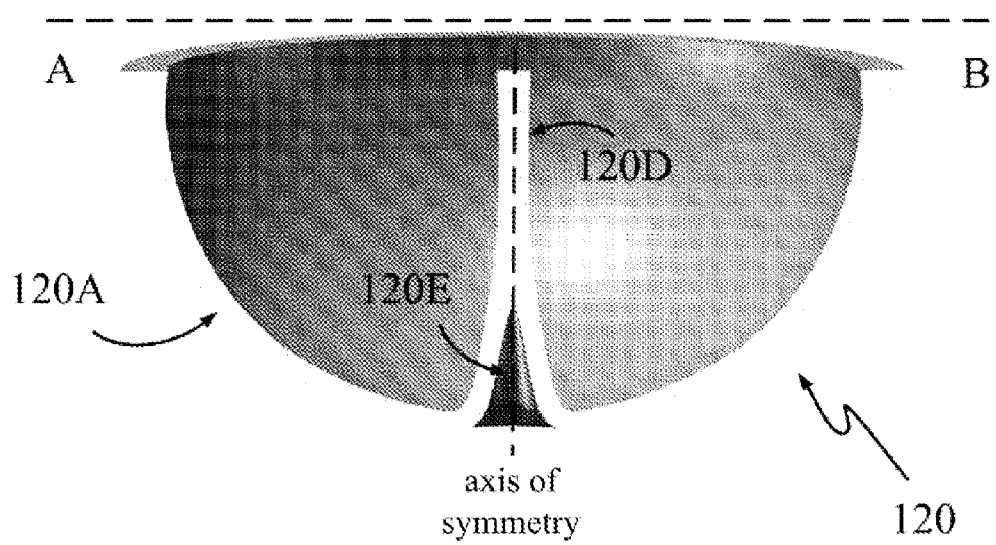
FIG. 2 is a sectional diagram of an assembly of a micro shell resonator and a composite structure substrate, where

As shown in FIG. 2, FIG. 3, and FIG. 6, a micro three-dimensional shell resonator gyroscope includes:

a packaging shell cover;

a micro shell resonator; and a composite structure substrate into which non-planar electrodes and a conductive structure are embedded;

The micro shell resonator is composed of a shell 6 and a single-ended stem 7 located at a central axis in the shell 6. The bottom of the single-ended stem 7 is flush with the bottom of a rim of the shell 6. The single-ended stem 7 is connected to a conductive structure E3 by means of a conductive layer E10, to be leaded out. The non-planar electrodes are embedded into the composite structure substrate, and include conventional electrodes E2, the conventional electrodes E2 including an even number of forcer electrodes and an even number of pick-off electrodes. The conductive structure E3 and the non-planar electrodes are leaded out by means of a conductive lead-out layer (including E12 and E13) from the backside of the composite structure substrate. The packaging shell cover and the composite structure substrate into which the non-planar electrodes and the conductive structure E3 are embedded are vacuum packaged, and a getter is placed in a cavity.

A diameter of the micro shell resonator ranges from 1 mm to 10 mm. A material of the micro shell resonator is one selected from the group consisting of an amorphous material, an iron-nickel alloy, or an oxide. The amorphous material is one selected from the group consisting of borosilicate glass, quartz glass, ultra-low expansion (ULE) titanium-silicate glass, and metallic glass. The metallic glass is made of an amorphous material composed of metal components, such as $Zr_{44}Ti_{11}Cu_{10}Ni_{10}Be_{25}$ and $Pt_{57.5}Cu_{14.7}Ni_{5.3}P_{22.5}$. The oxide may be formed of a single oxide or multiple oxides, such as $Al_2O_3$, $63HfO_2.37TiO_2$, $HfO_2.WO_3.Ta_2O_5$, $Al_2O_3.TiO_2$, $55Ta_2O_5.45WO_3$, and $37Ta_2O_5.63WO_3$. The iron-nickel alloy is composed of iron, nickel, and a small quantity of other components, such as an invar alloy, a super invar alloy, and a low-expansion iron-nickel alloy Carperter Super Invar 32-5. The shell thickness of the micro shell resonator longitudinally decreases from the rim to an apex, and the rim thickness of the shell ranges from 10 μm to 800 μm. A depth-to-width ratio of the micro shell resonator ranges from 0.5 to 1.2. A projection region of the rim of the micro shell resonator on the composite structure substrate resides between an inner edge and an outer edge of the region of the non-planar electrodes. When the micro shell resonator uses a non-conductive material, a surface of the micro shell resonator is coated or partially coated with a conductive layer 10, and the thickness of the conductive layer 10 ranges from 0.5 nm to 100 nm.

The shell rim of the micro shell resonator is provided with a flange 6p, and a lower surface of the flange 6p is further coated with a conductive layer 11, the thickness and the length of the flange 6p both ranging from 10 μm to 800 μm.

The single-ended stem 7 is one of a solid stem, a hollow stem, and a combination of a solid stem and a hollow stem.

The composite structure substrate into which the non-planar electrodes and the conductive structure are embedded is a composite-type substrate, which is composed of a part including the non-planar electrodes and the conductive structure E3, an electrical isolation part, and a main body part. A material of the electrical isolation part is glass, and a material of the main body part is silicon or glass. The material of the part including the non-planar electrodes and the conductive structure is a conductive material, the conductive material being one of highly doped conductive silicon, an invar alloy, metal, and metallic glass.

The forcer electrodes and the pick-off electrodes in the non-planar electrodes are each a circular ring sector.

The multiple non-planar electrodes further include a ring forcer electrode E15. The multiple non-planar electrodes further include one or more isolation electrodes E16.

A coefficient of thermal expansion of a material of the packaging shell cover matches that of a material of the main body part of the composite structure substrate. A diameter of the packaging shell cover is greater than that of the micro shell resonator. The height of the packaging shell cover is greater than that of the micro shell resonator. The packaging shell cover and the composite structure substrate are directly bonded or bonded by means of an intermediate layer, to achieve vacuum packaging.

An interval between the micro shell resonator and the composite structure substrate ranges from 0.5 μm to 100 μm, and an optimal interval is determined by the dimension of the micro shell resonator and a vacuum degree achieved after vacuum packaging.

The getter is placed in the cavity before vacuum packaging, resides on the packaging shell cover or on the composite structure substrate, and is activated after vacuum packaging.

FIG. 2 is a sectional diagram of an assembly of a micro shell resonator and a composite structure substrate, where FIG. 2a is a sectional diagram of an assembly of a micro shell resonator without a flange 6p and a composite structure substrate; FIG. 2b is a sectional diagram of an assembly of a micro shell resonator with a flange 6p and a composite structure substrate; FIG. 2c is a partial diagram of an assembly of a micro shell resonator with a flange 6p and a composite structure substrate; and FIG. 2d is a partial diagram of an assembly of a micro shell resonator provided with a modulation layer 6t on a flange and a composite structure substrate; The micro shell resonator is composed of the shell 6 and the single-ended stem 7; or may also be formed by the shell 6, the single-ended stem 7 and the flange 6p. The flange 6p may be provided with a modulation layer 6t, which is used to modulate a frequency splitting value of the resonator. The non-planar electrodes are mainly formed of the forcer electrodes and the pick-off electrodes, which are all represented by E2 in the figures. The non-planar electrodes may further include a ring forcer electrode E15 and an isolation electrode E16, as shown in FIG. 6. A main body part E6.1 of the composite structure substrate shown in FIG. 2 is glass.

FIG. 3 is a schematic sectional diagram of a micro shell resonator gyroscope, where FIG. 3a is a schematic sectional diagram of a whole of the micro shell resonator gyroscope; FIG. 3b is a schematic partial diagram of the micro shell resonator gyroscope, which shows that a main body part E4 of the composite structure substrate is silicon; and FIG. 3c is a schematic partial diagram of the micro shell resonator gyroscope, which shows that a main body part E6.1 of the composite structure substrate is glass. The situation shown in FIG. 3c corresponds to that shown in FIG. 2. A packaging shell is composed of a planar part 12 and a non-planar part 11. The planar part 12 and the composite structure substrate are directly bonded or bonded by means of an intermediate layer, to achieve vacuum packaging.

FIG. 6 is a schematic diagram of non-planar electrodes. FIG. 6a shows a composite structure substrate into which non-planar electrodes are embedded, where the composite structure substrate is provided with eight conventional electrodes E2 (including forcer electrodes and pick-off electrodes, represented by E2.1 to E2.8), a conductive structure E3, electrical isolation parts (including E6.1, E6.2 and E6.3), and a main body part E6.1, the E6.1 serving as both an electrical isolation part and the main body part of the composite structure substrate in this case. FIG. 6b shows a composite structure substrate into which non-planar electrodes are embedded, where the composite structure substrate is provided with eight conventional electrodes E2 (including forcer electrodes and pick-off electrodes, represented by E2.1 to E2.8), a conductive structure E3, electrical isolation parts (including E6.1, E6.2 and E6.3), and a main body part E6.1. The E6.1 serves as both an electrical isolation part and the main body part of the composite structure substrate in this case. The conductive structure E3 extends between every two conventional electrodes E2, resulting in a low parasitic capacitance and reduce interference between the electrodes E2. FIG. 6c shows a composite structure substrate into which non-planar electrodes are embedded, where the composite structure substrate has eight conventional electrodes E2 (including forcer electrodes and pick-off electrodes, represented by E2.1 to E2.8), an isolation electrode E16, a conductive structure E3, electrical isolation parts (including E6.1, E6.2 and E6.3), and a main body part E6.1. The E6.1 serves as both an electrical isolation part and the main body part of the composite structure substrate in this case. The isolation electrode E16 extends at inner sides of the conventional electrodes E2 and between every two conventional electrodes E2. FIG. 6d shows a composite structure substrate into which non-planar electrodes are embedded, where the composite structure substrate is provided with eight conventional electrodes E2 (including forcer electrodes and pick-off electrodes, represented by E2.1 to E2.8), an isolation electrode E16, a conductive structure E3, electrical isolation parts (including E6.1, E6.2 and E6.3), and a main body part E6.1. The E6.1 serves as both an electrical isolation part and the main body part of the composite structure substrate in this case. The isolation electrode E16 surrounds the conventional electrodes E2. FIG. 6e and FIG. 6f correspond to FIG. 6a, where the numbers of the conventional electrodes E2 are respectively 16 and 24 in the two figures. The non-planar electrodes in FIG. 6g include conventional electrodes E2 and a ring forcer electrode E15. A projection of a rim of the micro shell resonator on the composite structure substrate is located between outer-side electrodes (including E2.1.1 to E2.8.1) and inner-side electrodes (including E2.1.2-E2.8.2), and a main body part E6.1 of the composite structure substrate is glass. FIG. 6h corresponds to FIG. 6g, where a main body part E4 of the composite structure substrate is silicon. In FIG. 6, the conventional electrodes E2 include forcer electrodes and pick-off electrodes, where the number of the electrodes is not limited to 8, 16, or 24, and an even number such as 12, 20, 28, 32 or the like is also feasible.

Embodiment 3

As shown in FIG. 4 and FIG. 6, a micro three-dimensional shell resonator gyroscope is similar to that in Embodiment 2. A difference lies in that, in this embodiment, the bottom of a single-ended stem 7 is not flush with the bottom of a rim of a shell 6. The single-ended stem 7 is inserted into a composite structure substrate into which non-planar electrodes and a conductive structure E3 are embedded and is connected to the conductive structure E3 by means of a conductive layer E14, to be leaded out, or is directly inserted to the bottom of the substrate.

Embodiment 4

As shown in FIG. 5 and FIG. 6, a micro three-dimensional shell resonator gyroscope is similar to that in Embodiment 2. A difference lies in that, in this embodiment, the bottom of a single-ended stem 7 is flush with the bottom of a rim of a shell 6. The single-ended stem 7 is inserted into a composite structure substrate into which non-planar electrodes and a conductive structure E3 are embedded and is connected to the conductive structure E3 by means of a conductive layer E14, to be leaded out, or is directly inserted to the bottom of the substrate.

Embodiment 5

As shown in FIG. 7 and FIG. 8, a method for fabricating a micro shell resonator 120 includes the following steps:

step 1: machining on a substrate wafer 121 to form a cavity 123 with pillars 122;

step 2: introducing a foaming agent 125 in the form of a solution or a suspension 124 into the cavity 123 on the substrate wafer 121;

step 3: heating to remove water from the solution or the suspension 124 in the cavity 123 on the substrate wafer 121, to leave the foaming agent 125;

step 4: sealing the cavity 123 through bonding between the substrate wafer 121 obtained in step 3 and a structural wafer 126, to form a bonded wafer; and step 5: heating the bonded wafer obtained in step 4 above the softening point or the melting point of the structural wafer 126, to form a micro shell resonator 120.

In step 1, the machining is one of micro-electrical discharge machining, micro-ultrasonic machining, dry etching, and wet etching; or a combination of wet etching and one selected from micro-electrical discharge machining, micro-ultrasonic machining, and dry etching.

In step 2, the foaming agent 125 is a substance which decomposes in a high temperature to releases a gas, including one of titanium hydride, zirconium hydride, calcium carbonate, magnesium carbonate, barium carbonate, strontium carbonate, and calcium bicarbonate, or a mixture thereof.

In step 3, the foaming agent 125 is added into the cavity by: first successively adding one solution and another solution for a chemical reaction to form the foaming agent, and then heating to remove water; or adding multiple solutions together for a reaction to form the foaming agent, and then heating to remove water; or adding a solution or suspension and then heating to remove water, leaving the foaming agent.

In step 4, a material of the structural wafer 126 is one selected from the group consisting of an amorphous material, an iron-nickel alloy, or an oxide. The amorphous material includes borosilicate glass, quartz glass, ultra-low expansion (ULE) titanium-silicate glass, and metallic glass. The metallic glass is made of an amorphous material composed of metal components, such as $Zr_{44}Ti_{11}Cu_{10}Ni_{10}Be_{25}$ and $Pt_{57.5}Cu_{14.7}Ni_{5.3}P_{22.5}$; the oxide is formed of a single oxide or multiple oxides, including $Al_2O_3$, $63HfO_2.37TiO_2$, $HfO_2.WO_3.Ta_2O_5$, $Al_2O_3.TiO_2$, $55Ta_2O_5.45WO_3$, and $37Ta_2O_5.63WO_3$. The iron-nickel alloy is composed of iron, nickel, and a small quantity of other components, such as an invar alloy, a super invar alloy, and a low-expansion iron-nickel alloy Carperter Super Invar 32-5.

Figures 1, 8B:
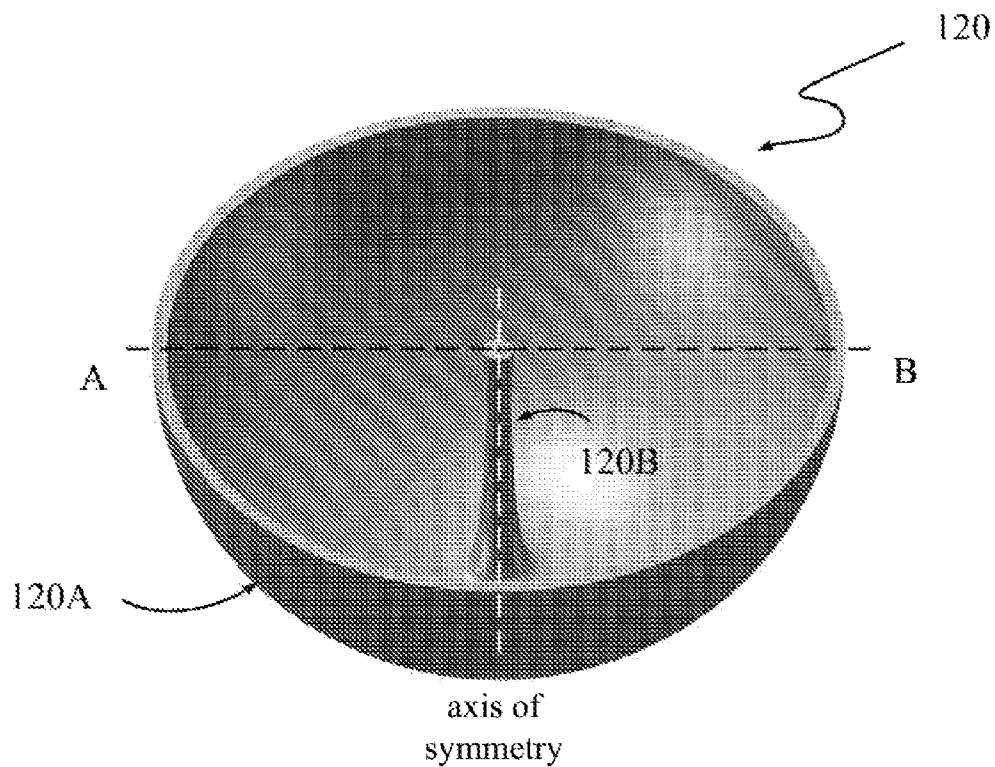
Figures 2, 8B:
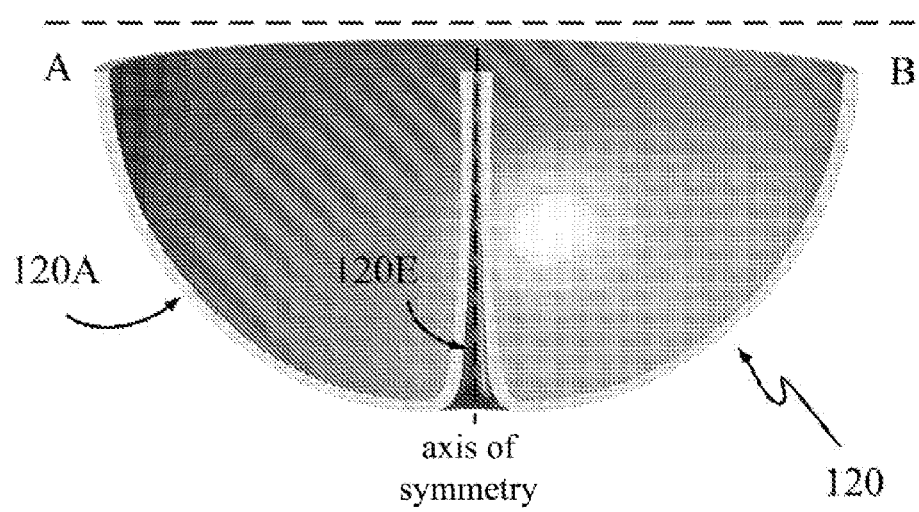
Figures 1, 8C:
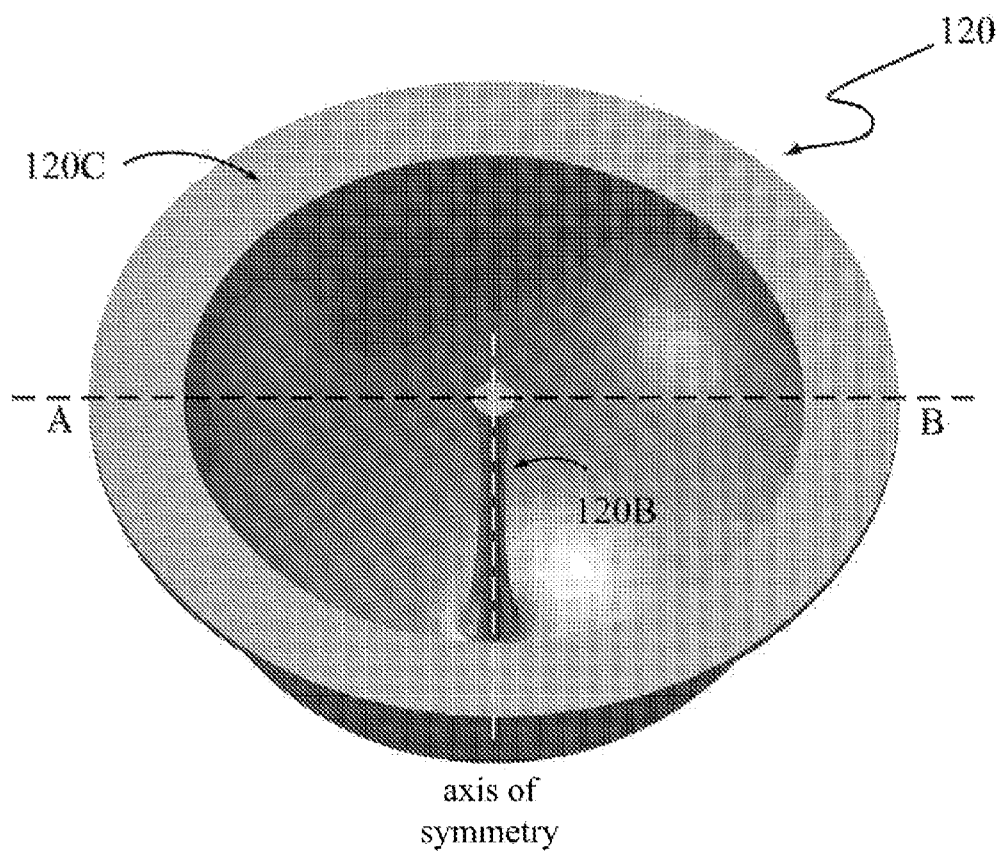
Figures 2, 8C:
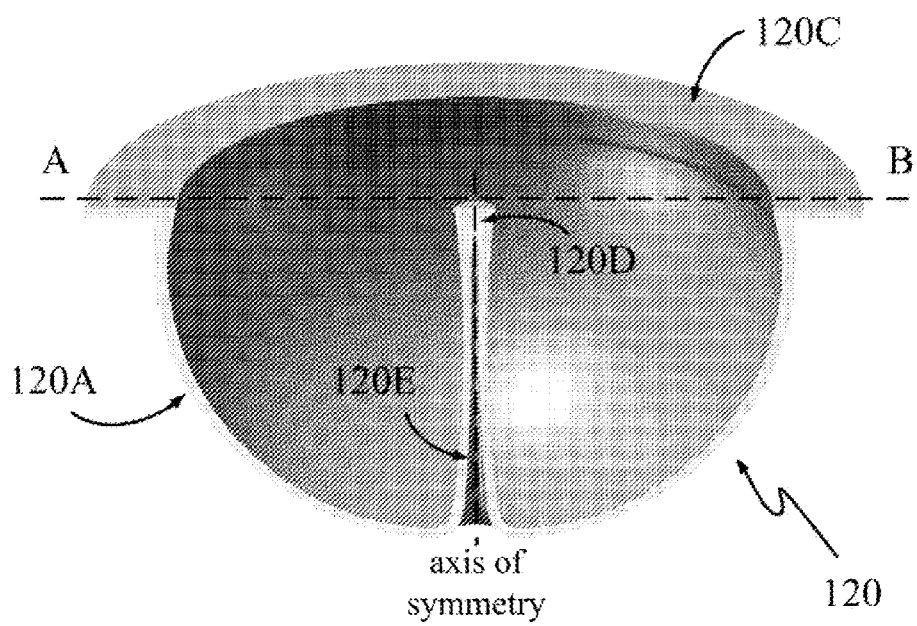

FIG. 8a to FIG. 8c are schematic diagrams of three micro shell resonators 120 based on the fabrication process shown in FIG. 7. A single-ended stem 120B in FIG. 8a includes a solid part 120D and a hollow part 120E. A single-ended stem 120B in FIG. 8b is a hollow stem, where a hollow part 120E extends through the single-ended stem 120B. FIG. 8c shows a micro shell resonator 120 with a flange 120C.

Embodiment 6

Figure 9:
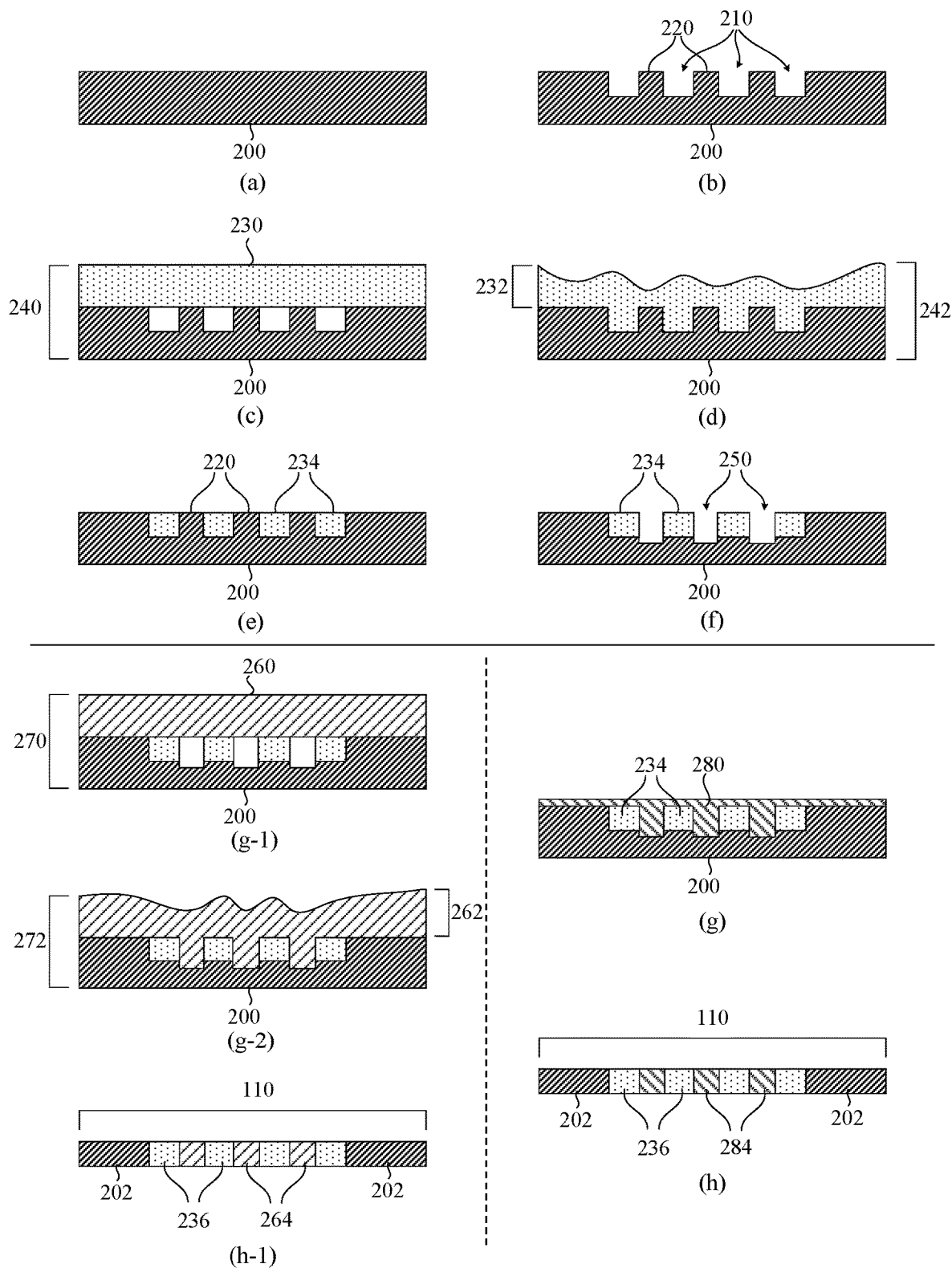
FIG. 9 is a flowchart of two fabrication processes of a composite structure substrate.
Figure 10A:
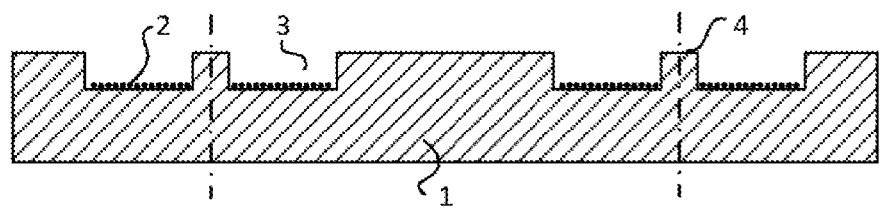
FIG. 10a to FIG. 10f are flowcharts of a fabrication process of a micro shell resonator.
Figure 10B:
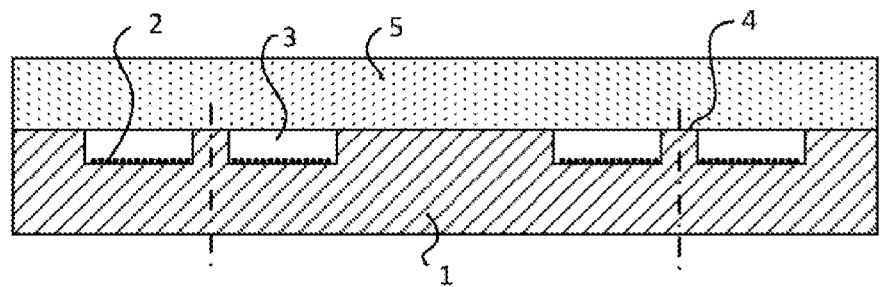
Figure 10C:
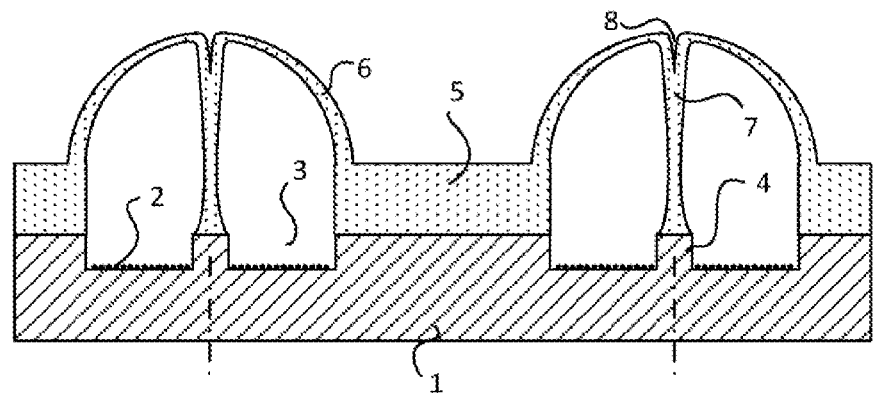
Figure 10D:
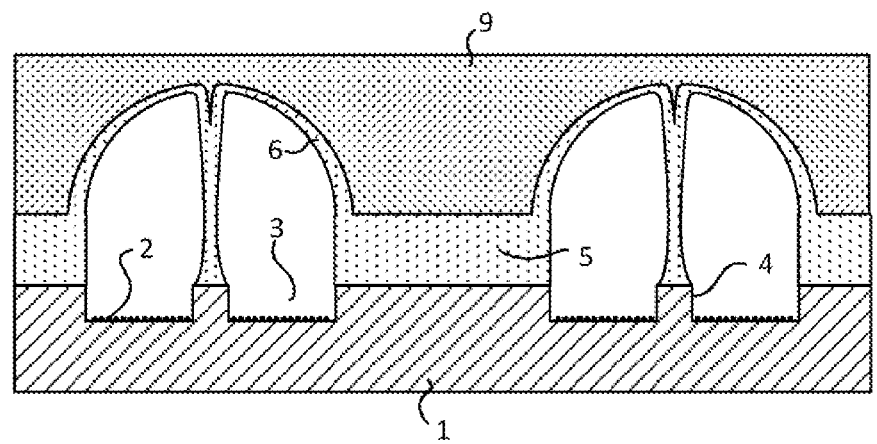
Figure 10E:
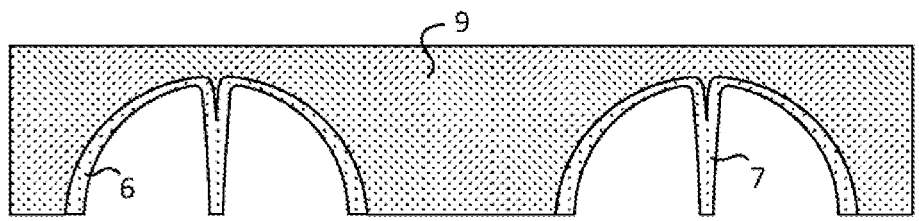
Figure 10F:
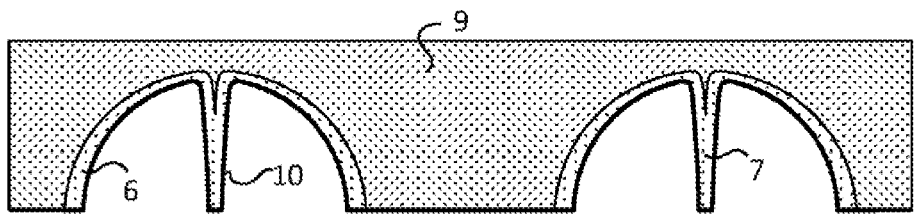
Figure 11A:
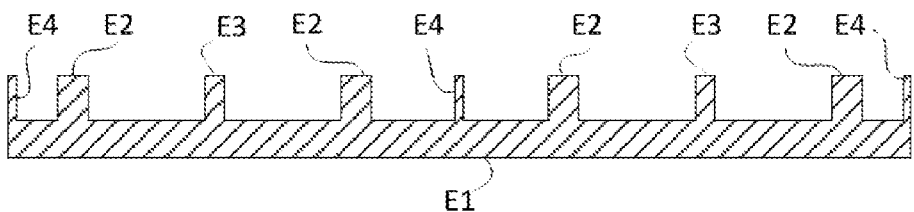
FIG. 11a to FIG. 11e are flowcharts of a fabrication process of a composite structure substrate different from that in FIG. 9.
Figure 11B:
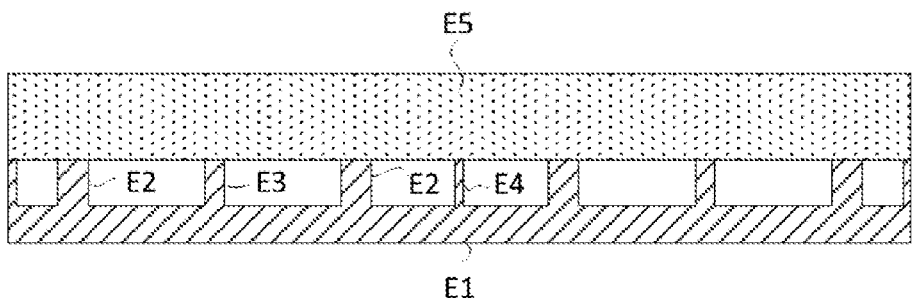
Figure 11C:
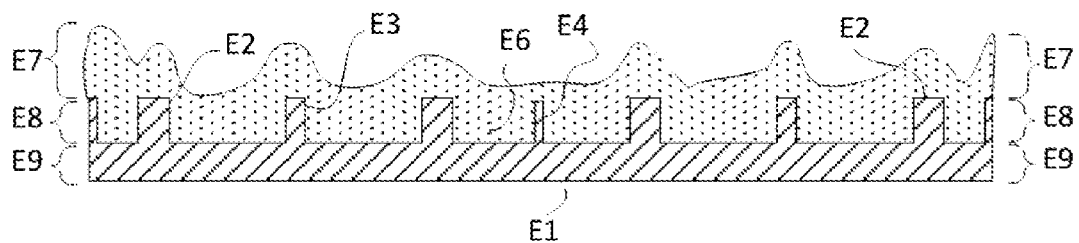
Figure 11D:
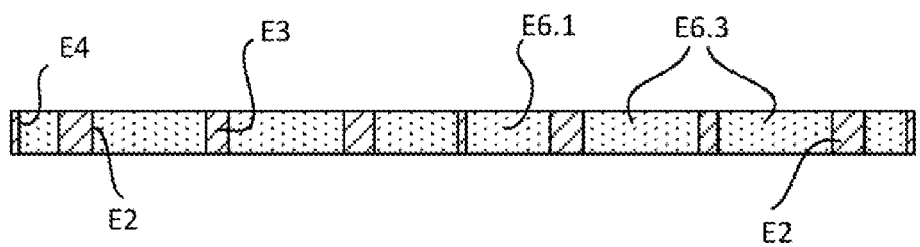
Figure 11E:
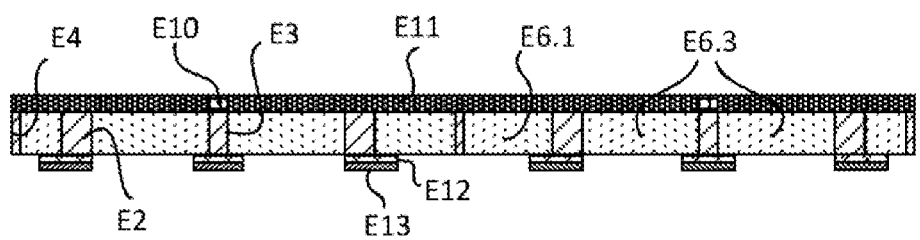

As shown in FIG. 9h-1, this embodiment provides a composite structure substrate 110, which includes:
- a glass part 236;
- a silicon part 202; and
- an embedded conductive part 264, where a main body of the composite structure substrate 110 is the glass part 236 or the silicon part 202; and
a material of the glass part is borosilicate glass.

In this embodiment, a material of the embedded conductive part 264 is metallic-glass. The embedded conductive part 264 is a conductive through glass via (TGV), an inductor, a capacitor, a filter, or an amplifier.

As shown in FIG. 9a to FIG. 9f, FIG. 9g-1, FIG. 9g-2, and FIG. 9h-1, a method for fabricating a composite structure substrate 110 provided in this embodiment includes the followings steps:

step 1: as shown in FIG. 9b, forming a cavity 210 on a silicon substrate wafer 200 through dry etching, silicon pillars 220 being formed in the cavity 210, and a depth of the cavity 210 being 300 μm;

step 2: as shown in FIG. 9c, anodicaly bonding a glass wafer 230 to one side of the silicon substrate wafer 200 with the cavity 210, to form a bonded wafer 240, the bonding occurring in a vacuum environment;

step 3: as shown in FIG. 9d, placing the bonded wafer 240 in a heating furnace, a heating temperature being higher than the softening point of the glass wafer 230; maintaining the temperature till the whole cavity 210 is filled with glass; and then lower the temperature to room temperature, to form a reflowed wafer 242;

step 4: as shown in FIG. 9e, completely removing a pure glass layer 232 from the reflowed wafer 242 by means of thinning, grinding, and chemical-mechanical polishing;

step 5: as shown in FIG. 9f, removing, through dry etching or wet etching, the silicon pillars 220 surrounded with glass 234, to form a second cavity 250; and step 6: if a material of the embedded conductive part 264 is metallic glass, performing the following steps a1 to c1:

step a1: as shown in FIG. 9g-1, bonding a metallic glass wafer 260 to the silicon substrate wafer 200 obtained in step 5, to form a second bonded wafer 270;

step b1: as shown in FIG. 9g-2, placing the second bonded wafer 270 in a heating furnace under a nitrogen or inert gas atmosphere and at a temperature higher than the softening point of the metallic glass wafer 260; maintaining the temperature till the whole second cavity 250 is filled with the metallic glass; and then lowering the temperature to room temperature, to form a second reflowed wafer 272; and step c1: as shown in FIG. 9h-1, removing a pure metallic glass layer 262 and a bottom silicon layer from the second reflowed wafer 272 by means of thinning, grinding, and chemical-mechanical polishing, till the glass 234 reflowing into the cavity 210 is exposed, to obtain the composite structure substrate 110.

Embodiment 7

As shown in FIG. 9h, this embodiment provides a composite structure substrate 110, having a structure similar to that in Embodiment 7. A difference lies in that a material of an embedded conductive part 284 in this embodiment is an invar alloy or a super invar alloy.

As shown in FIG. 9a to FIG. 9f, FIG. 9g and FIG. 9h, in this embodiment, a method for fabricating the composite structure substrate 110 includes the followings steps:

step 1 to step 5: identical to those in Embodiment 6.

step 6: if a material of the embedded conductive part 284 is an invar alloy or a super invar alloy, performing the following steps a2 and b2:

step a2: as shown in FIG. 9g, electroplating the silicon substrate wafer 200 obtained in step 5 with the invar alloy or super invar alloy 280, to fill the second cavity 250; and step b2: as shown in FIG. 9h, removing the thin invar alloy or super invar alloy layer and a bottom silicon layer from the silicon substrate wafer 200 obtained in step a2 by means of thinning, grinding, and chemical-mechanical polishing, till glass 234 reflowing into the cavity 210 is exposed, to obtain the composite structure substrate 110.

Embodiment 8

Figure 12A:
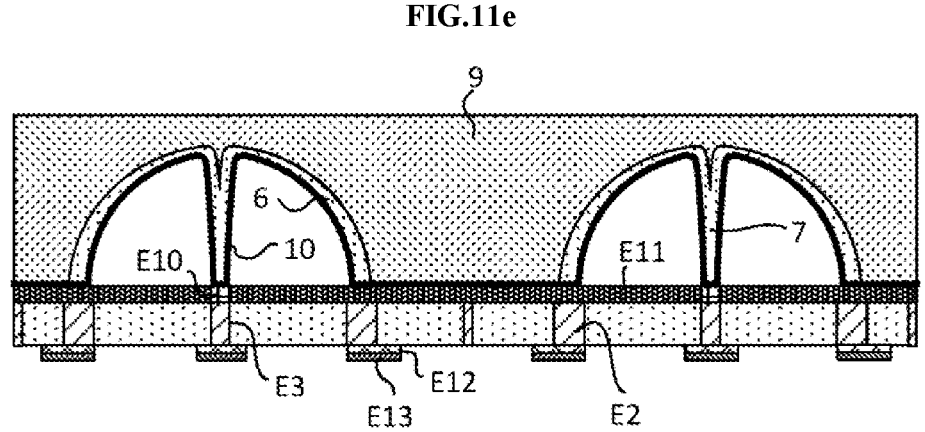
FIG. 12a and FIG. 12b are process flowcharts of assembling a resonator and a composite structure substrate.
Figure 12B:
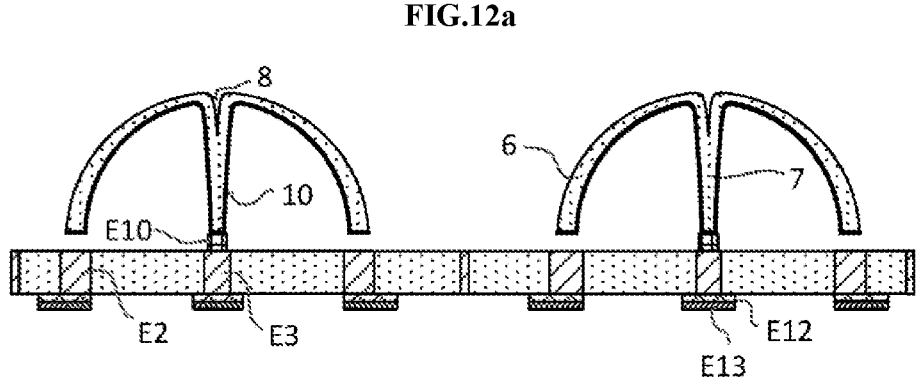

As shown in FIG. 10 to FIG. 12, a method for fabricating a micro three-dimensional shell resonator gyroscope includes the following steps:

(1) As shown in FIG. 10, wafer-level fabrication of a glass micro shell resonator by a foaming process, which includes the following steps:

step 1: dry-etching a silicon wafer to form a dry-etched silicon wafer 1, such that a cylindrical cavity 3 internally including a silicon cylinder 4 is formed; and adding a foaming agent 2 into the cylindrical cavity 3;

step 2: bonding a glass wafer 5 to an upper surface of the dry-etched silicon wafer 1, and to an upper surface of the silicon cylinder 4 in the cylindrical cavity 2, to form a bonded wafer;

step 3: placing the bonded wafer obtained in step 2 in a high-temperature heating furnace to evenly heat the bonded wafer, a heating temperature being higher than the softening point of the glass wafer 5; where the foaming agent 2 decomposes in the high temperature to generate a gas, such that a gas pressure in the cylindrical cavity 3 sharply increases; driven by a gas pressure difference and surface tension, the softened glass forms a micro shell resonator; glass at the silicon cylinder 4 forms a single-ended stem 7; and then the temperature is rapidly lowered to room temperature;

step 4: evenly coating a surface of the bonded wafer with the micro shell resonator obtained in step 3 with a thick protective layer 9, the protective layer being an organic material, an inlay, or paraffin;

step 5: grinding and chemical-mechanically polishing the bonded wafer obtained in step 4, wherein the bonded wafer is evenly coated with a thick protective layer 9 on the upper surface step 4, to remove a planar part of the bonded wafer and reserve the micro shell resonator; and step 6: evenly coating a part or a whole of an inner surface of the micro shell resonator reserved in step 5 with a conductive layer 10.

(2) As shown in FIG. 11, wafer-level fabrication of silicon non-planar electrodes by a thermal reflow process, which includes the following steps:

step 7: dry-etching a highly doped silicon wafer to form a silicon wafer E1, such that a cylindrical cavity internally including silicon pillars is formed, the silicon pillar serving as silicon non-planar electrodes E2 and a silicon lead-out passage E3;

step 8: bonding, in a vacuum, a glass wafer E5 to an upper surface of the silicon wafer E1 and to an upper surface of the silicon pillar in the cylindrical cavity, to form a bonded wafer;

step 9: placing the bonded wafer obtained in step 8 in a heating furnace to heat the bonded wafer, a heating temperature being higher than the softening point of the glass wafer E5; maintaining the temperature till the whole cylindrical cavity is filled with softened glass; and then lowering the temperature to room temperature, to form a three-layer reflowed wafer in which a full-glass structure layer E7 is formed on the upper part, a composite structure layer E8 into which the silicon non-planar electrode E2 and the silicon lead-out passage E3 are embedded is formed in the middle, and a full-silicon substrate structure layer E9 is formed on the bottom;

step 10: grinding and chemical-mechanically polishing the reflowed wafer, to remove the upper full-glass structure layer E7 and the bottom full-silicon substrate structure layer E9, leaving the composite structure layer E8 into which the silicon non-planar electrode E2 and the silicon lead-out passage E3 are embedded; and step 11: arranging metal wires E12 and E13 on a lower surface of the composite structure layer E8, coating an upper surface with a sacrificial layer E11, and arranging a metal adhesive layer E11) on the silicon lead-out passage E3.

(3) As shown in FIG. 12, assembly of the glass micro shell resonator with the silicon non-planar electrodes, which includes the following steps:

step 12: bonding the composite structure layer E8 arranged with the metal wires E12 and E13, coated with the sacrificial layer E11 on the upper surface, and arranged with the metal adhesive layer E10 on the silicon lead-out passage E3, obtained in step 11 and the glass micro shell resonator evenly coated with the conductive layer 10, obtained in step 6, to form a whole structure; and step 13: removing the protective layer 9 and the upper-surface sacrificial layer E11 from the whole structure.

(4) Vacuum packaging (not shown), which includes the following steps:

step 14: fabricating a glass packaging shell cover by a foaming process; and step 15: bonding the glass packaging shell cover to the composite structure substrate in a glass micro shell resonator gyroscope obtained in step 13, to achieve vacuum packaging.

In step 1, the thickness of the silicon wafer is not less than 300 μm. The dry etching is deep reactive ion etching, and an etching depth is 100 μm or more less than the thickness of the silicon wafer. The foaming agent 2 is a substance capable of releasing a gas in a high temperature.

In step 4, the surface of the bonded wafer is evenly coated with the protective layer 9, the protective layer 9 being above the top of the glass shell 6 in step 3 in height.

In step 8, the thickness of the glass wafer E5 is not less than the etching depth of the silicon wafer in step 7, and a glass with a coefficient of thermal expansion similar to that of silicon is used as the glass wafer E5.

In step 11, the thickness of the sacrificial layer E11 ranges from 0.5 μm to 50 μm, and a photoresist can be used as the sacrificial layer.

The above merely describes preferred embodiments of the present application. It should be noted that, several improvements and modifications may be made by those of ordinary skill in the art without departing from the principle of the present invention, and these improvements and modifications should also be considered within the protection scope of the present invention.

What is claimed is:

1. A micro three-dimensional shell resonator gyroscope, comprising:
   a packaging shell cover;
   a micro shell resonator; and
   a composite structure substrate, wherein a plurality of non-planar electrodes and a conductive structure are embedded in the composite structure substrate;
   wherein the micro shell resonator comprises a shell and a single-ended stem located at a central axis in the shell; the plurality of non-planar electrodes include conventional electrodes, wherein the conventional electrodes includes an even number of forcer electrodes and an even number of pick-off electrodes; the single-ended stem of the micro shell resonator is electrically connected with the conductive structure in the composite structure substrate by means of a conductive layer, and achieves electrical lead-out by means of a conductive lead-out layer from a backside of the composite structure substrate; the conductive structure and the plurality of non-planar electrodes are leaded out by means of the conductive lead-out layer from the backside of the composite structure substrate; and the packaging shell cover and the composite structure substrate are vacuum-packaged, and a getter is placed in a cavity formed by the packaging shell cover and the composite structure substrate.

2. The micro three-dimensional shell resonator gyroscope of claim 1, wherein the micro three-dimensional shell resonator gyroscope further comprises a fixed support structure; a bottom of the single-ended stem is flush with a bottom of a rim of the shell; the single-ended stem is inserted into the fixed support structure, and is connected to the conductive structure in the composite structure substrate by means of the conductive layer, to be leaded out.

3. The micro three-dimensional shell resonator gyroscope of claim 1, wherein a bottom of the single-ended stem is not flush with a bottom of a rim of the shell; the single-ended stem is inserted into the composite structure substrate and connected to the conductive structure by means of a conductive layer, to be leaded out, or is directly inserted through a conductive through via to a bottom of the composite structure substrate.

4. The micro three-dimensional shell resonator gyroscope of claim 1, wherein a bottom of the single-ended stem is flush with a bottom of a rim of the shell; the single-ended stem is inserted into the composite structure substrate, and is connected to the conductive structure by means of a conductive layer, to be leaded out.

5. The micro three-dimensional shell resonator gyroscope of claim 1, wherein a thickness of the shell of the micro shell resonator longitudinally decreases from a rim to an apex.

6. The micro three-dimensional shell resonator gyroscope of claim 1, wherein a rim of the shell of the micro shell resonator is provided with a flange.

7. The micro three-dimensional shell resonator gyroscope of claim 1, wherein when the micro shell resonator uses a non-conductive material, a surface of the micro shell resonator is coated or partially coated with a conductive layer.

8. The micro three-dimensional shell resonator gyroscope of claim 1, wherein a projection region of the rim of micro shell resonator on the composite structure substrate resides between an inner edge and an outer edge of a region of the plurality of non-planar electrodes.

9. The micro three-dimensional shell resonator gyroscope of claim 1, wherein the composite structure substrate is a composite-type substrate, and comprises a part including the plurality of non-planar electrodes and the conductive structure, an electrical isolation part, and a main body part.

10. The micro three-dimensional shell resonator gyroscope of claim 1, wherein the forcer electrodes and the pick-off electrodes in the plurality of non-planar electrodes are each a circular ring sector.

11. The micro three-dimensional shell resonator gyroscope of claim 1, wherein the plurality of non-planar electrodes further comprise a ring forcer electrode.

12. The micro three-dimensional shell resonator gyroscope of claim 1, wherein the plurality of non-planar electrodes further comprises one or more isolation electrodes.

13. A method for fabricating a micro shell resonator, comprising the following steps:
   step 1: machining on a substrate wafer to form a cavity with pillars;
   step 2: introducing a foaming agent as a solution or a suspension into the cavity on the substrate wafer;
   step 3: heating to remove water from the solution or the suspension in the cavity on the substrate wafer, to leave the foaming agent;
   step 4: sealing the cavity by bonding the substrate wafer obtained in step 3 and a structural wafer, to form a bonded wafer; and
   step 5: heating the bonded wafer obtained in step 4 above a softening point or a melting point of the structural wafer, to form the micro shell resonator.

14. The method for fabricating a micro shell resonator of claim 13, wherein in step 1, the machining is one selected from the group consisting of micro-electrical discharge machining, micro-ultrasonic machining, dry etching, wet etching, and a combination of wet etching and one of micro-electrical discharge machining and micro-ultrasonic machining.

15. The method for fabricating a micro shell resonator of claim 13, wherein in step 2, the foaming agent is a substance decomposing in a high temperature to releases a gas, the substance is selected from the group consisting of titanium hydride, zirconium hydride, calcium carbonate, magnesium carbonate, barium carbonate, strontium carbonate, and calcium bicarbonate, and a mixture thereof.

16. The method for fabricating a micro shell resonator of claim 13, wherein in step 3, the foaming agent is added into the cavity by first successively adding one solution and another solution for a chemical reaction to form the foaming agent, and then heating to remove water; or by adding multiple solutions together for a chemical reaction to form the foaming agent, and then heating to remove water; or by adding a solution or suspension and then heating to remove water, leaving the foaming agent.

17. The method for fabricating a micro shell resonator of claim 13, wherein in step 4, a material of the structural wafer is one selected from the group consisting of an amorphous material, an iron-nickel alloy, and an oxide; the amorphous material comprises borosilicate glass, quartz glass, ultra-low expansion (ULE) titanium-silicate glass, and metallic glass; the oxide is formed of a single oxide or multiple oxides; the iron-nickel alloy is composed of iron, nickel, and a small quantity of other components, including an invar alloy, a super invar alloy, and a low-expansion iron-nickel alloy, Carperter Super Invar 32-5.

18. A method for fabricating a composite structure substrate, comprising the followings steps:
   step 1: forming a cavity on a silicon substrate wafer through dry etching, the cavity including silicon pillars therein;
   step 2: anodically bonding a glass wafer to one side of the silicon substrate wafer with the cavity, to form a bonded wafer, the anodically bonding occurring in a vacuum environment to obtain the bonded wafer;
   step 3: placing the bonded wafer in a heating furnace, a heating temperature being higher than a softening point of the glass wafer; maintaining the temperature till the whole cavity is filled with glass; and then lowering the temperature to room temperature, to form a reflowed wafer;
   step 4: completely removing a pure glass layer from the reflowed wafer by means of thinning, grinding, and chemical-mechanical polishing;
   step 5: removing the silicon pillars surrounded with glass through dry etching or wet etching, to form a second cavity; and
   step 6: machining an embedded conductive part into the second cavity on the silicon substrate wafer obtained in step 5, and removing a bottom silicon layer till glass reflowing into the cavity is exposed, to obtain the composite structure substrate.

19. The method for fabricating a composite structure substrate of claim 18, wherein if a material of the embedded conductive part is metallic glass in step 6, the following steps are performed:
   step a1: bonding a metallic glass wafer to the silicon substrate wafer obtained in step 5, to form a second bonded wafer;
   step b1: placing the second bonded wafer in a heating furnace under a nitrogen or inert gas atmosphere and at a temperature higher than a softening point of the metallic glass wafer; maintaining the temperature till the whole second cavity is filled with the metallic glass; and then lowering the temperature to room temperature, to form a second reflowed wafer; and
   step c1: removing a pure metallic glass layer and a bottom silicon layer from the second reflowed wafer by means of thinning, grinding, and chemical-mechanical polishing, till the glass reflowing into the cavity is exposed, to obtain the composite structure substrate.

20. The method for fabricating a composite structure substrate of claim 18, wherein if a material of the embedded conductive part is an invar alloy or a super invar alloy in step 6, the following steps are performed:
   step a2: electroplating the silicon substrate wafer obtained in step 5 with the invar alloy or super invar alloy, to fill the second cavity; and
   step b2: removing the invar alloy or super invar alloy and a bottom silicon layer from the silicon substrate wafer obtained in step a2 by means of thinning, grinding, and chemical-mechanical polishing, till glass reflowing into the cavity is exposed, to obtain the composite structure substrate.

21. A method for fabricating a micro three-dimensional shell resonator gyroscope, comprising the following steps:
   (1) a wafer-level fabrication of a glass micro shell resonator by a foaming process, including the following steps:
      step 1: dry-etching a silicon wafer to form a dry-etched silicon wafer, such that a cylindrical cavity internally including a silicon cylinder is formed in the dry-etched silicon wafer; and adding a foaming agent into the cylindrical cavity;

step 2: bonding a glass wafer to an upper surface of the dry-etched silicon wafer formed after dry-etching the silicon wafer in step 1, and to an upper surface of the silicon cylinder in the cylindrical cavity, to form a bonded wafer;

step 3: placing the bonded wafer obtained in step 2 in a high-temperature heating furnace to evenly heat the bonded wafer, a heating temperature being higher than the softening point of the glass wafer; wherein the foaming agent decomposes in the high temperature to generate a gas, such that a gas pressure in the cylindrical cavity sharply increases; driven by a gas pressure difference and surface tension, the softened glass forms a micro shell resonator; glass at the silicon cylinder forms a single-ended stem; and then the temperature is rapidly lowered to room temperature;

step 4: evenly coating a protective layer on an upper surface of the bonded wafer with the micro shell resonator obtained in step 3, the protective layer being an organic material, an inlay, or paraffin;

step 5: grinding and chemical-mechanically polishing the bonded wafer with the micro shell resonator obtained in step 4, wherein the bonded wafer is evenly coated with the protective layer on an upper surface of the bonded wafer, to remove a planar part of the bonded wafer and reserve the micro shell resonator; and step 6: evenly coating a part or a whole of an inner surface of the micro shell resonator reserved in step 5 with a conductive layer;

(2) a wafer-level fabrication of silicon non-planar electrodes by a thermal reflow process, including the following steps:

step 7: dry-etching a highly doped silicon wafer to form a dry-etched silicon wafer, such that a cylindrical cavity internally including silicon pillars is formed in the dry-etched silicon wafer, the silicon pillars serving as silicon non-planar electrodes and a silicon lead-out passage;

step 8: bonding a glass wafer in a vacuum condition to an upper surface of the dry-etched silicon wafer and to an upper surface of the silicon pillar in the cylindrical cavity, to form a bonded wafer;

step 9: placing the bonded wafer obtained in step 8 in a heating furnace to heat the bonded wafer, a heating temperature being higher than the softening point of the glass wafer; maintaining the temperature till the whole cylindrical cavity is filled with softened glass; and then lowering the temperature to room temperature, to form a three-layer reflowed wafer, in the three-layer reflowed wafer, a full-glass structure layer is formed on an upper part, a composite structure layer is formed in the middle, and a full-silicon substrate structure layer is formed on a bottom; the silicon non-planar electrodes and the silicon lead-out passage are embedded into the composite structure layer;

step 10: grinding and chemical-mechanically polishing the reflowed wafer, to remove the upper full-glass structure layer and the bottom full-silicon substrate structure layer, leaving the composite structure layer; and step 11: arranging a metal wire on a lower surface of the composite structure layer, coating an upper surface with a sacrificial layer, and arranging a metal adhesive layer on the silicon lead-out passage;

(3) assembly of the glass micro shell resonator with the silicon non-planar electrodes, comprising the following steps:

step 12: bonding the composite structure layer deposited with the metal wire, coated with the sacrificial layer on the upper surface, and arranged with the metal adhesive layer on the silicon lead-out passage obtained in step 11, and the glass micro shell resonator evenly coated with the conductive layer obtained in step 6, to form a whole structure; and step 13: removing the protective layer and the upper-surface sacrificial layer from the whole structure; and (4) vacuum packaging, comprising the following steps:

step 14: fabricating a glass packaging shell cover by a foaming process; and step 15: bonding the glass packaging shell cover to the composite structure substrate in a glass micro shell resonator gyroscope obtained in step 13, to achieve the vacuum packaging.

* * * * *